United States Patent
Liu et al.

(10) Patent No.: US 12,381,551 B2
(45) Date of Patent: *Aug. 5, 2025

(54) METHOD OF OPERATING DECOUPLING SYSTEM, AND METHOD OF FABRICATING SAME

(71) Applicant: TAIWAN SEMICONDUCTOR MANUFACTURING COMPANY, LTD., Hsinchu (TW)

(72) Inventors: Szu-Lin Liu, Hsinchu (TW); Yi-Hsiang Wang, Hsinchu (TW); Jaw-Juinn Horng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/182,831

(22) Filed: Mar. 13, 2023

(65) Prior Publication Data

US 2023/0231554 A1     Jul. 20, 2023

Related U.S. Application Data

(63) Continuation of application No. 17/167,690, filed on Feb. 4, 2021, now Pat. No. 11,606,089.

(Continued)

(51) Int. Cl.
*H03K 17/687*     (2006.01)
*H03K 5/1252*     (2006.01)
(Continued)

(52) U.S. Cl.
CPC ....... *H03K 17/6871* (2013.01); *H03K 5/1252* (2013.01); *H10D 1/66* (2025.01); *H10D 8/00* (2025.01)

(58) Field of Classification Search
CPC ............. H03K 17/6871; H03K 5/1252; H01L 29/861; H01L 29/94
See application file for complete search history.

(56) References Cited

U.S. PATENT DOCUMENTS 4,071,830 A    1/1978  Huntington
5,789,964 A *  8/1998  Voldman .............. H03K 17/162
                                                 327/437

(Continued)

FOREIGN PATENT DOCUMENTS

JP    H11195935       7/1999
KR    20000071849    11/2000

OTHER PUBLICATIONS

Office Action dated Jul. 25, 2022 from corresponding case No. KR 10-2021-0044135 (pp. 1-5).

(Continued)

*Primary Examiner* — Metasebia T Retebo
(74) *Attorney, Agent, or Firm* — Hauptman Ham, LLP

(57) ABSTRACT

A method (of decoupling from voltage variations in a first voltage drop between first and second reference voltage rails) includes: electrically coupling one or more components to form a decoupling capacitance (decap) circuit; electrically coupling one or more components to form a filtered biasing circuit; and making an unswitched series electrical coupling of the decap circuit and the filtered biasing circuit between the first and second reference voltage rails.

20 Claims, 16 Drawing Sheets

Related U.S. Application Data

(60) Provisional application No. 63/057,101, filed on Jul. 27, 2020, provisional application No. 63/057,093, filed on Jul. 27, 2020.

(51) Int. Cl.
*H10D 1/66* (2025.01)
*H10D 8/00* (2025.01)

(56) References Cited

U.S. PATENT DOCUMENTS

| | | |
|---|---|---|
| 6,204,723 B1 | 3/2001 | Houghton et al. |
| 6,529,042 B1 | 3/2003 | Hiramoto et al. |
| 6,844,771 B1 | 1/2005 | Chen |
| 7,348,835 B2 | 3/2008 | Yamazaki et al. |
| 8,134,824 B2 | 3/2012 | Frederick et al. |
| 8,493,075 B2 | 7/2013 | Feng et al. |
| 8,610,188 B2 | 12/2013 | Kerber et al. |
| 11,606,089 B2 * | 3/2023 | Liu .................... H03K 17/6871 |
| 2001/0022528 A1 | 9/2001 | Houghton et al. |
| 2004/0085141 A1 * | 5/2004 | Senthilkumar ........ H03B 5/368 |
| | | 331/36 C |
| 2007/0159208 A1 | 7/2007 | Chen |
| 2008/0079492 A1 | 4/2008 | Kobayashi et al. |
| 2018/0231996 A1 | 8/2018 | Shay |

OTHER PUBLICATIONS

Office Action dated Jan. 28, 2022 for corresponding case No. DE 10 2021 102 951.1 (pp. 1-10).

* cited by examiner

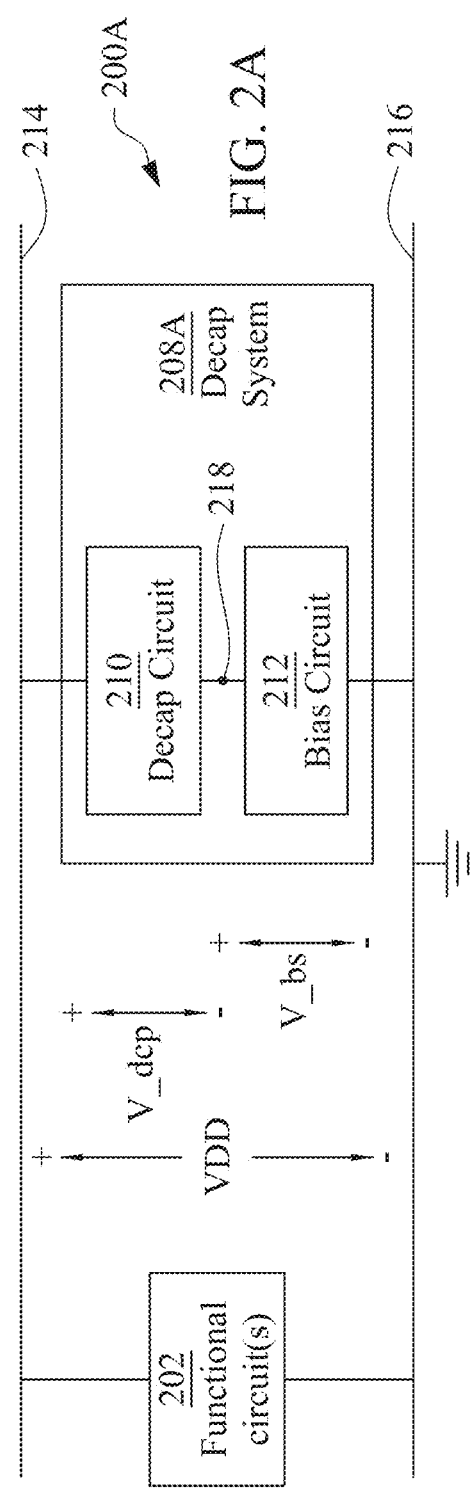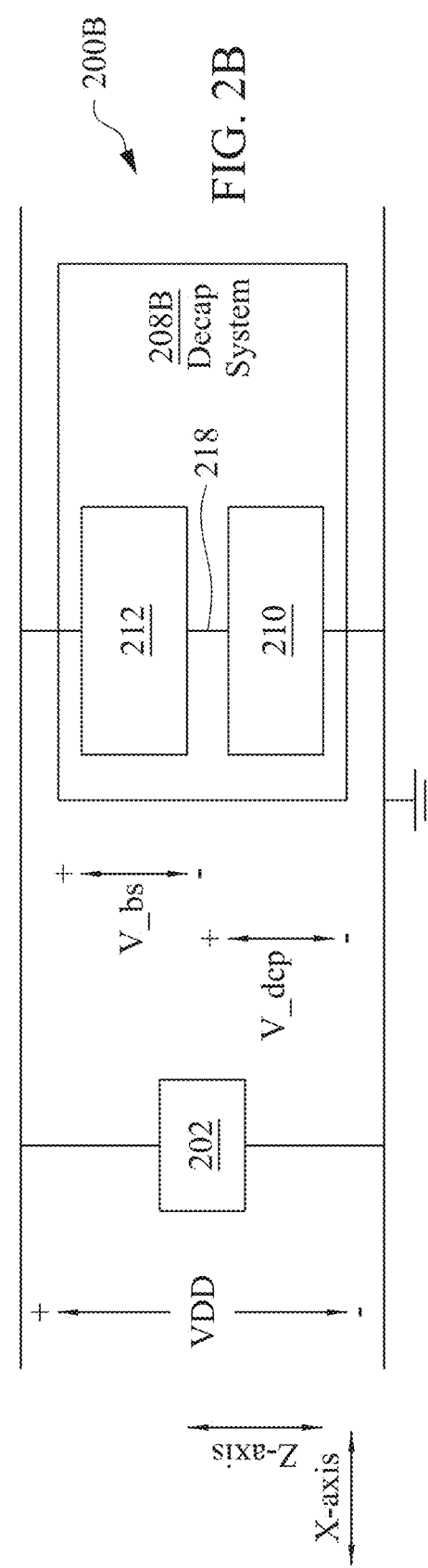

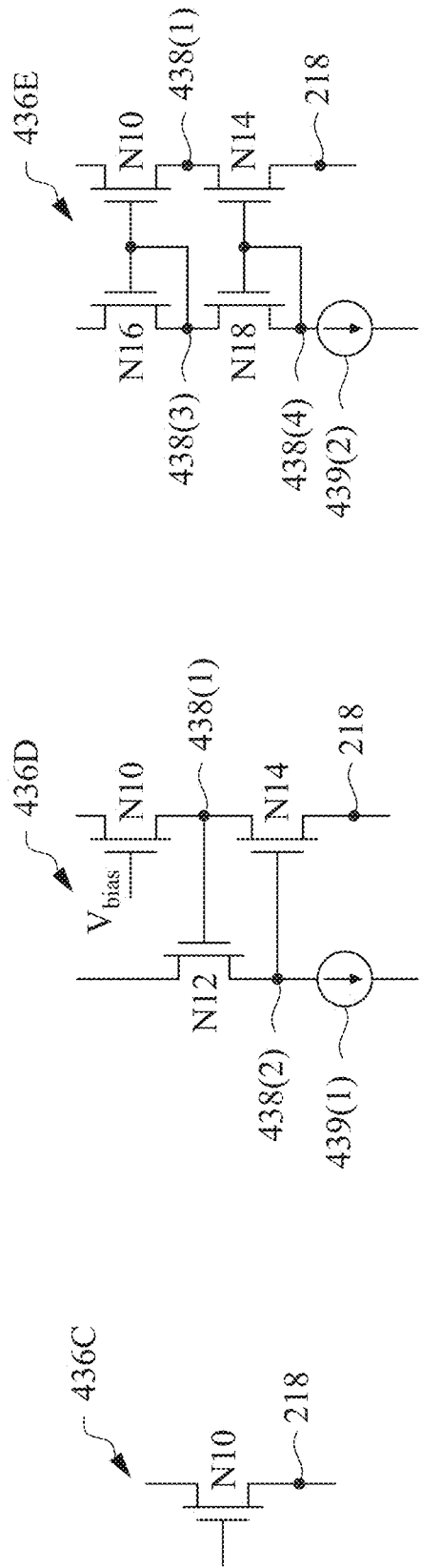
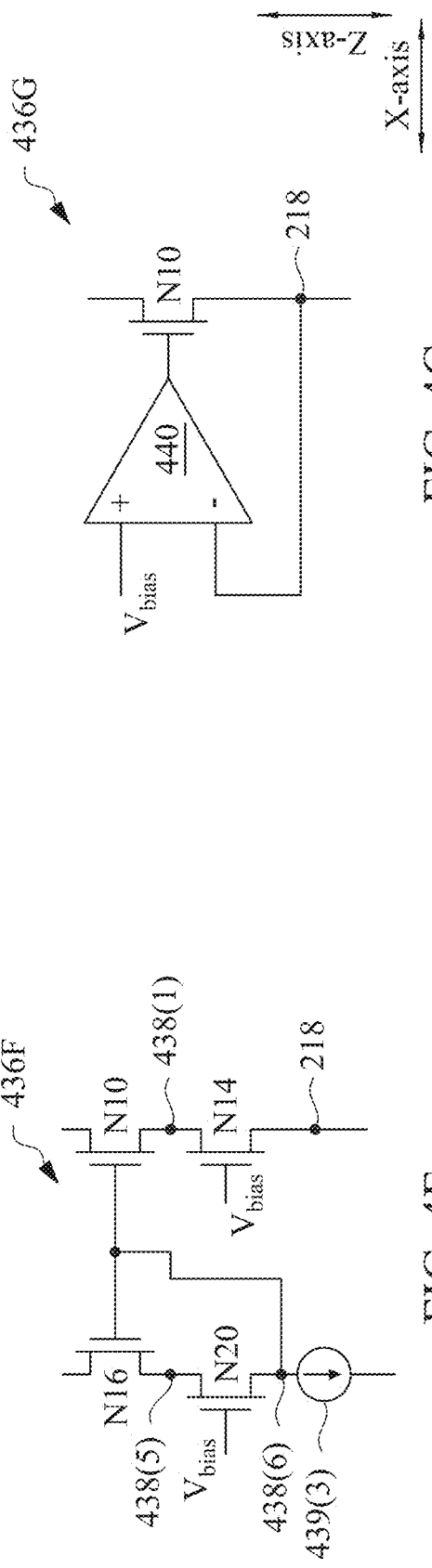

METHOD OF OPERATING DECOUPLING SYSTEM, AND METHOD OF FABRICATING SAME

PRIORITY CLAIM AND CROSS-REFERENCE

The present application is a continuation of U.S. application Ser. No. 17/167,690, filed Feb. 4, 2021, now U.S. Pat. No. 11,606,089, issued Mar. 23, 2023, which claims the priority of U.S. Provisional Application No. 63/057,093, filed Jul. 27, 2020, and 63/057,101, filed Jul. 27, 2020, each of which is incorporated herein by reference in its entirety.

BACKGROUND

An integrated circuit ("IC") includes one or more semiconductor devices. One way in which to represent a semiconductor device is with a plan view diagram referred to as a layout diagram. Layout diagrams are generated in a context of design rules. A set of design rules imposes constraints on the placement of corresponding patterns in a layout diagram, e.g., geographic/spatial restrictions, connectivity restrictions, or the like. Often, a set of design rules includes a subset of design rules pertaining to the spacing and other interactions between patterns in adjacent or abutting cells where the patterns represent conductors in a layer of metallization.

Typically, a set of design rules is specific to a process/technology node by which will be fabricated a semiconductor device based on a layout diagram. The design rule set compensates for variability of the corresponding process/technology node. Such compensation increases the likelihood that an actual semiconductor device resulting from a layout diagram will be an acceptable counterpart to the virtual device on which the layout diagram is based.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2B are corresponding block diagrams, in accordance with some embodiments.

FIGS. 4A-4G are corresponding circuit diagrams, in accordance with some embodiments.

DETAILED DESCRIPTION

Figure 1A:
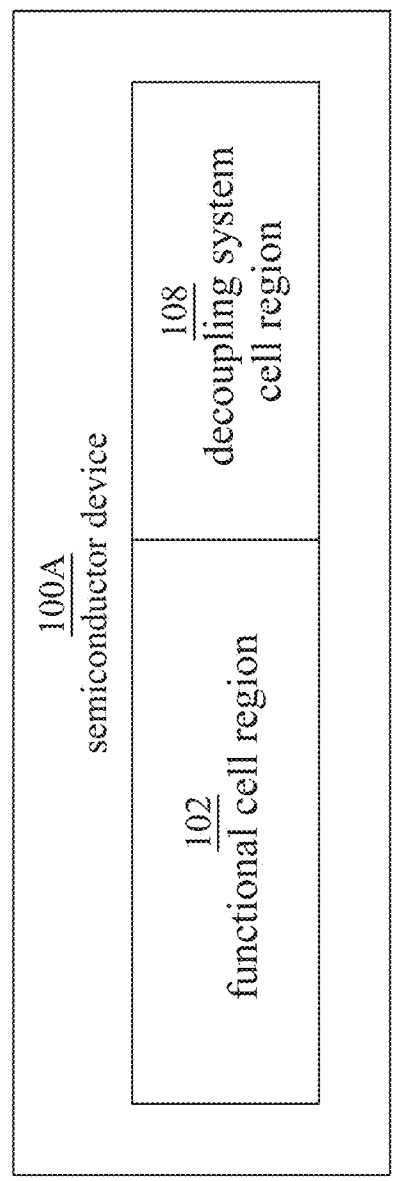
FIGS. 1A-IC are corresponding block diagrams of a semiconductor device, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for case of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a decoupling capacitance (decap) system is provided which includes a decap circuit and a bias circuit. The decap circuit is coupled between a first reference voltage rail (e.g., which provides VDD) or second reference voltage rail (e.g., which provides VSS) and a first node. A voltage drop across the decap circuit is V_dcp. In some embodiments, each of the decap circuit and the bias circuit includes thin oxide metal-oxide-semiconductor field-effect transistors (MOSFETs). In some embodiments, the MOSFETS in the decap circuit have a capacitor configuration. The biasing circuit is coupled between the first node and correspondingly the second or first reference voltage rail. In some embodiments, the MOSFETS in the biasing circuit have a diode configuration. According to another approach, a decap circuit corresponding to above-noted decap circuit is provided between VDD and VSS albeit not in series with a bias circuit so that a voltage drop across the decap circuit (V_other) according to the other approach is VDD. According to at least some embodiments in which the decap circuit is coupled in series with the biasing circuit, one or more thin dielectric, e.g., oxide, metal-oxide-semiconductor field-effect transistors (MOSFETs) in the decap circuit have an advantage of being less susceptible to breakdown of the thin gate oxide and/or current leakage as compared to one or more MOSFETs in the decap circuit according to the other approach because V_dep is less than VDD, whereas V_other=VDD according to the other approach.

FIG. 1A is a block diagram of a semiconductor device 100A, in accordance with some embodiments.

Semiconductor device 100A includes a functional cell region 102 and a decoupling system cell region 108 (see FIGS. 2A-2B, 3A-3B, 4A-4B, or the like). The latter, namely decoupling system cell region 108, provides a function of capacitive decoupling. The term "functional" is applied to cell region 102 to indicate that cell region 102 provides a function which is different than the function provided by decoupling system cell region 108.

Figure 1B:
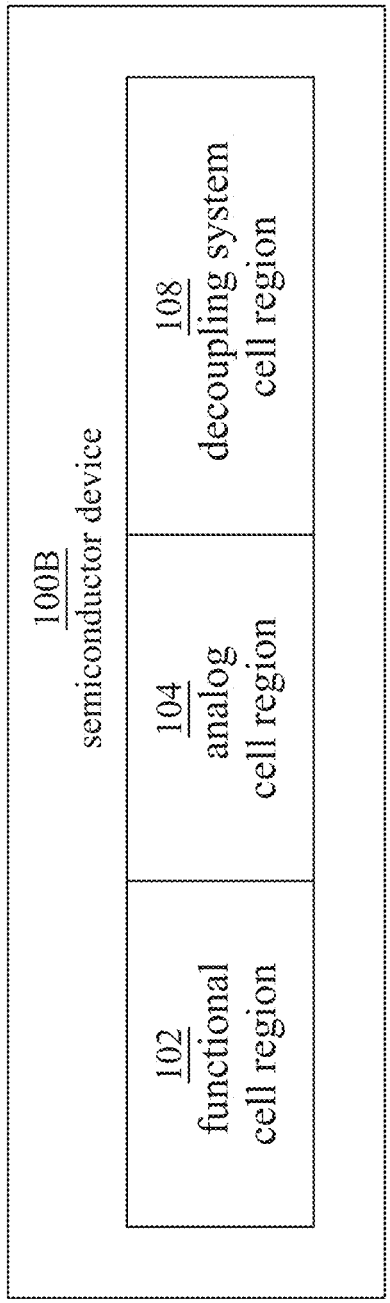

FIG. 1B is a block diagram of a semiconductor device 100B, in accordance with some embodiments.

Semiconductor device 100B of FIG. 1B is similar to the semiconductor device 100A of FIG. 1A. However, functional cell region 102 of semiconductor device 100B further includes an analog cell region 104.

Figure 1C:
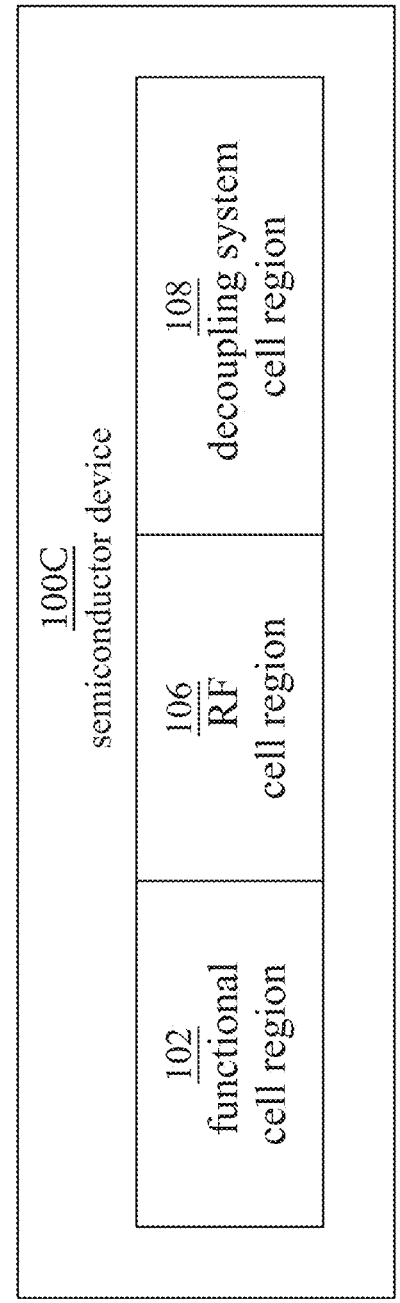

FIG. 1C is a block diagram of a semiconductor device 100C, in accordance with some embodiments.

Semiconductor device 100C of FIG. 1C is similar to the semiconductor device 100A of FIG. 1B. However, functional cell region 102 of semiconductor device 100C further includes a radio frequency (RF) cell region 106.

FIG. 2A is a block diagram of a decoupling system 200A, in accordance with some embodiments.

Decoupling system 200A includes one or functional circuits 202 and a decoupling capacitance (decap) system 208A. The one or more functional circuits 202 are an example of functional cell region 102 of FIG. 1A. Decap system 208A is an example of decoupling system cell region 108 of FIG. 1A.

In FIG. 2A, the one or more functional circuits 202 and decap system 208A are electrically coupled in parallel between rails 214 and 216. Hereinafter, for brevity, "coupled" (and similar variants) will be recited in place of "electrically coupled" (and similar variants) with the understanding that the adverb "electrically" is implied.

Decap system 208A provides a function of capacitive decoupling. More particularly, decap system 208A helps to decouple the one or more functional circuits 202 from variations in VDD. The term "functional" is applied to the one or more circuits 202 to indicate that the one or more circuits 202 provide corresponding functions which are different than the function provided by decap system 208A.

In FIG. 2A, rail 214 provides a first reference voltage. Rail 216 provides a second reference voltage. In FIG. 2A (and other figures discussed herein) the first and second reference voltages correspondingly are VDD and VSS. In some embodiments, the first and second reference voltages are voltages other than correspondingly VDD and VSS.

Decap system 208A includes a decap circuit 210 coupled in series with a bias circuit 212. Substantially all of the capacitive decoupling functionality of decap system 208A is provided by decap circuit 210. More particularly, decap circuit 210 is coupled between an input of decap system 208A and a node 218, the latter being internal to decap system 208A. Bias circuit 212 is coupled between node 218 and an output of decap system 208A.

In some embodiments, in terms of voltage drop, decap system 208A is described as a voltage divider. A voltage drop between rails 214 and 216 is VDD. Accordingly, a voltage drop across decap system 208A is VDD. A voltage drop across decap circuit 210 is V_dcp. A voltage drop across bias circuit 212 is V_bs. As such, in some embodiments, the voltage drop across decap system 208A is VDD is represented by a first equation, $$VDD = V\_dcp + V\_bs.$$

Rewriting the first equation yields a second equation, $$V\_dcp = VDD - V\_bs.$$

In some embodiments, the adjective "bias" as applied to circuit 212 refers to an effect of voltage drop V_bs because voltage drop V_bs reduces (or biases) voltage drop V_dcp, where voltage drop V_dcp otherwise would equal VDD if not for bias circuit 212 being coupled in series with decap circuit 210 between rails 214 and 216.

According to another approach, a decap circuit corresponding to decap circuit 210 is provided between VDD and VSS albeit not in series with a bias circuit so that a voltage drop across the decap circuit (V_other) according to other approach is VDD. According to at least some embodiments in which decap circuit 210 is coupled in series with bias circuit 212, one or more thin oxide metal-oxide-semiconductor field-effect transistors (MOSFETs) in decap circuit 210 (see FIG. 2A, or the like) have an advantage of being less susceptible to breakdown of the thin gate dielectric, e.g., oxide, and/or current leakage as compared to one or more MOSFETs in the decap circuit according to the other approach because V_dep is less than VDD, whereas V_other=VDD according to the other approach.

FIG. 2B is a block diagram of a decoupling system 200B, in accordance with some embodiments.

System 200B of FIG. 2B is similar to system 200A of FIG. 2A. However, the series arrangement of decap circuit 210 and bias circuit 212 in FIG. 2B is different than in FIG. 2A. More particularly, in FIG. 2B, bias circuit 212 is coupled between the input of decap system 208B and node 218, and decap circuit 210 is coupled between node 218 and the output of decap system 208B.

Figure 3A:
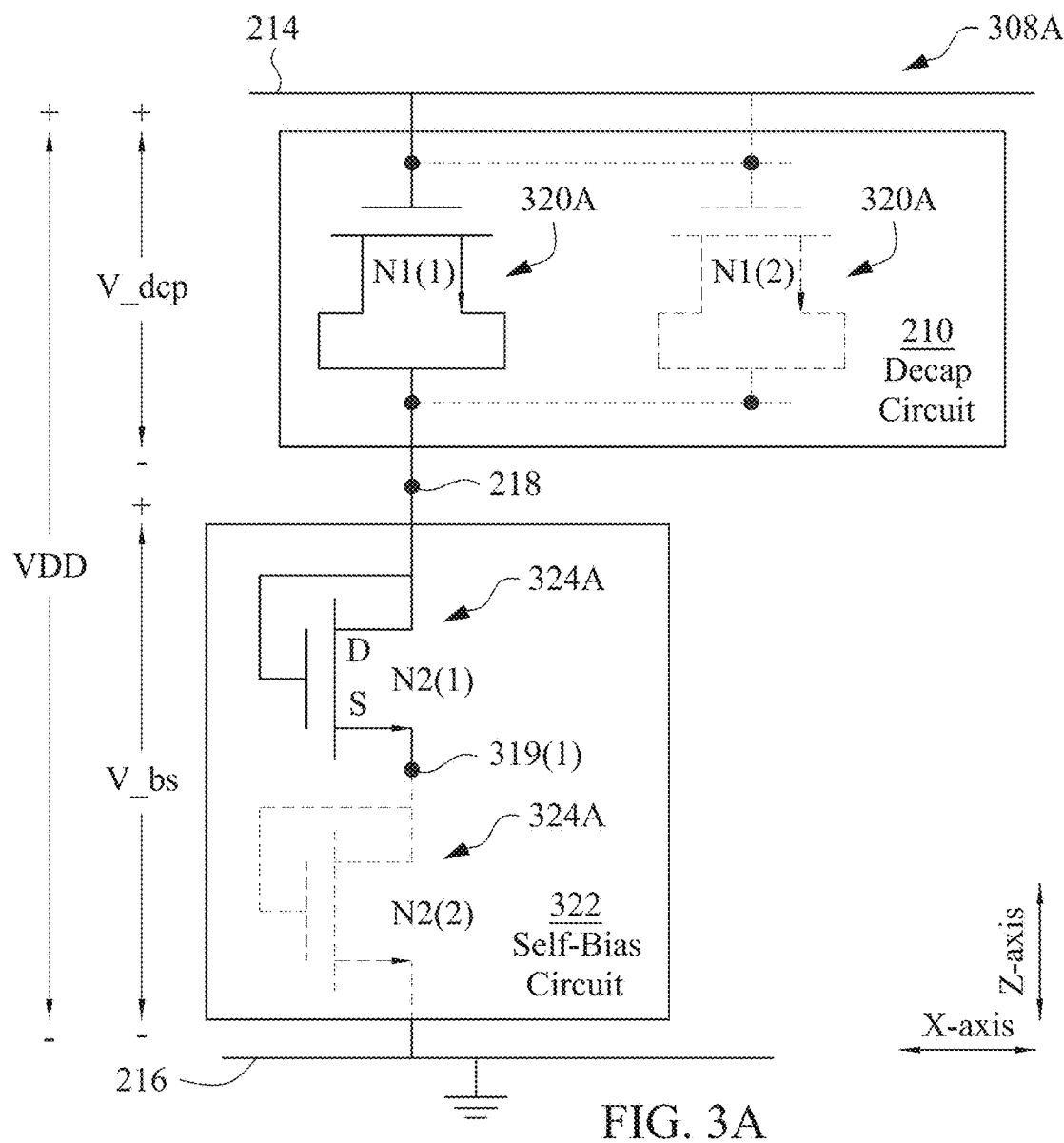
FIGS. 3A-3J are corresponding circuit diagrams, in accordance with some embodiments.
Figure 3B:
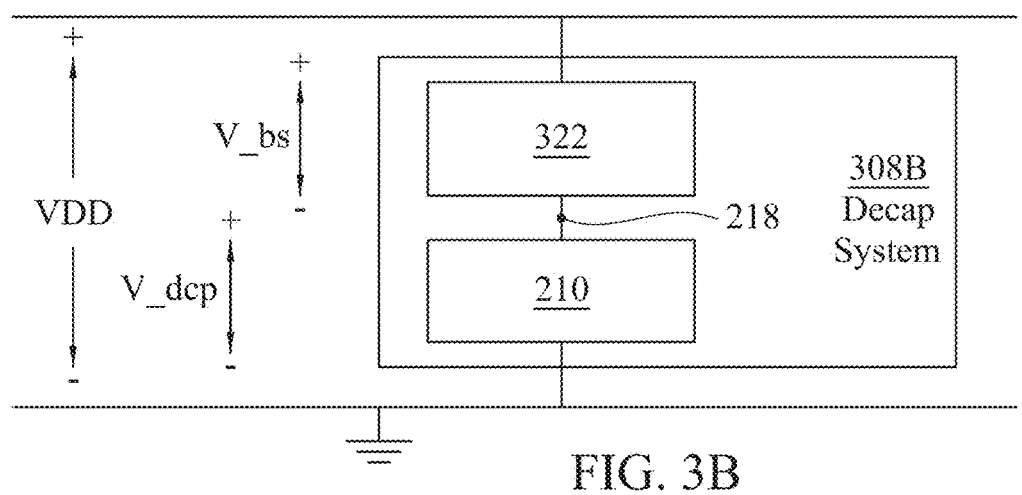

FIG. 3A is a circuit diagram of a decap system 308A, in accordance with some embodiments. FIG. 3B is a block diagram of a decap system 308B, in accordance with some embodiments. FIGS. 3C-3J are corresponding circuit diagrams, in accordance with some embodiments. FIG. 3K is a layout diagram 308K, in accordance with some embodiments.

FIGS. 3A-3K follow a similar numbering scheme to that of FIGS. 2A-2B. Though corresponding, some components also differ. To help identify components which correspond but nevertheless have differences, the numbering convention uses 3-series numbers for FIGS. 3A-3K while the numbering convention for FIGS. 2A-2B uses 2-series numbers. For example, item 308A in FIG. 3A is a decap system and corresponding item 208A in FIG. 2A is a decap system, and wherein: similarities are reflected in the common root _08A; and differences are reflected in the corresponding leading digit 3 in FIG. 3A and 2 in FIG. 2A. For brevity, the discussion will focus more on differences between FIGS. 3A-3K and FIGS. 2A-2B than on similarities.

Whereas each of FIGS. 2A-2B includes bias circuit 212, FIG. 3A includes a particular type of bias circuit 212, namely self-bias circuit 322. Accordingly, self-bias circuit 322 has at least the same advantages as those of bias circuit 212 discussed above. Also, FIG. 3A shows decap circuit 210 in more detail as compared to FIGS. 2A-2B.

In FIG. 3A, substantially all of the capacitive decoupling functionality of decap system 308A is provided by decap circuit 210. In FIG. 3A, decap circuit 210 includes one or more capacitor-configured MOSFETs N1(1) and N1(2)), which are coupled in parallel. As N1(2) is optional, it is shown using phantom (dashed) lines. In some embodiments, decap circuit 210 includes N1(1), N1(2) and one or more capacitor-configured MOSFETs coupled in parallel.

In some embodiments, capacitor-configuring a MOSFET includes coupling the gate terminal to a first voltage, and coupling each of the source and drain terminals to a second voltage which is different than the first voltage. In FIG. 3A, relative to NFET N1(1), according to orientation 320A, the gate terminal of N1(1) is coupled to rail 214 and each of the source and drain terminals of N1(1) is coupled to node 218 in a capacitor-configuration.

A net capacitance of capacitors coupled in parallel is the sum of the individual capacitances. Assuming that each of N1(1) and N1(2) has substantially the same capacitance, C_N1(x), for an embodiment in which decap circuit 210 includes only N1(1) and N1(2), then a total capacitance of decap circuit 210 is 2*C_N1(x).

A MOSFET includes a layer of dielectric material between the gate terminal and a channel region. In some embodiments, the dielectric material is an oxide. Hereinafter, the layer of dielectric material between the gate terminal and the channel region of a MOSFET is generally referred to as the gate oxide of the MOSFET.

In some embodiments, each of N1(1) and N1(2) is thin-oxide type of MOSFET, as contrasted with a thick-oxide type MOSFET. A thin-oxide type of MOSFET has a relatively thinner gate oxide, a relatively higher maximum operating frequency and a relatively lower maximum operating voltage. A thick-oxide type of MOSFET has a relatively thicker gate oxide, a relatively lower maximum operating frequency and a relatively higher maximum operating voltage. In some embodiments, a thin oxide MOSFET has a gate oxide thickness of that is equal to or less than about 0.2 nanometers (nm).

In some embodiments, the gate oxide includes one or more layers of silicon oxide, silicon nitride, silicon oxynitride, or high-k dielectric materials such as hafnium oxide (HfO2), TiO2, HfZrO, Ta2O3, HfSiO4, $ZrO_2$, ZrSiO2, or combinations thereof. Alternatively, the high-k dielectric materials include metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof, or the like.

As shown in FIG. 3A, each of N1(1) and N1(2) is an N-type MOSFET (NFET). Also as shown in FIG. 3A, each of N1(1) and N1(2) is coupled between rail 214 and node 218 with an orientation 320A.

Figure 3C:
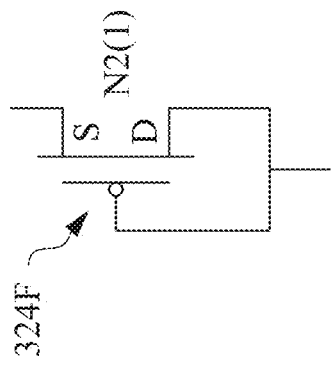

In some embodiments, each of NFETs N1(1)-N1(2) is arranged according to orientation 320C of FIG. 3C. In FIG. 3C, relative to NFET N1(1), according to orientation 320C, each of the source and drain terminals of N1(1) is coupled to rail 214 and the gate terminal of N1(1) is coupled to node 218.

Figure 3D:
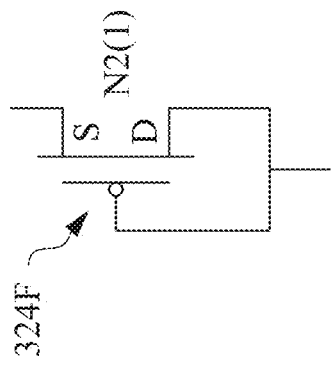
Figure 3E:
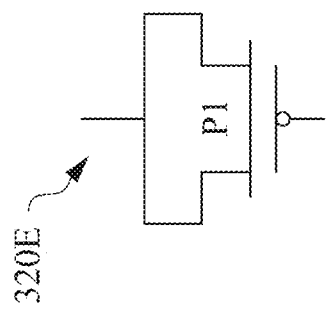

In some embodiments, each of NFETs N1(1) and N1(2) instead is a corresponding P-type MOSFET (PFET) P1(1) and P1(2) (not shown). In some embodiments, each of P1(1) and P2(2) has an orientation 320D shown in FIG. 3D. In FIG. 3D, relative to PFET P1(1), according to orientation 320D, the gate terminal of P1(1) is coupled to rail 214 and each of the source and drain terminals of P1(1) is coupled to node 218. In some embodiments, each of PFETs P1(1)-P1(2) is arranged according to orientation 320E of FIG. 3E. In FIG. 3E, relative to PFET P1(1), according to orientation 320E, each of the source and drain terminals of P1(1) is coupled to rail 214 and the gate terminal of P1(1) is coupled to node 218.

Returning to the discussion of FIG. 3A, self-bias circuit 322 includes one or more diode-configured MOSFETs N2(1) and N2(2) coupled in series between node 218 and rail 216. In some embodiments, diode-configuring an NFET includes coupling each of the gate and drain terminal to a first voltage, and coupling the source terminal to a second voltage which is different than the first voltage. In some embodiments, diode-configuring a PFET includes coupling the source terminal to a first voltage, and coupling each of the gate and drain terminals to a second voltage which is different than the first voltage.

In some embodiments, each of N2(1) and N2(2) is thin-oxide type of MOSFET. As N2(2) is optional, it is shown using phantom (dashed) lines. More particularly, N2(1) is coupled between node 218 and a node 319(1) which is internal to self-bias circuit 322. MOSFET N2(2) is coupled between node 319(1) and rail 216. In an embodiment in which self-bias circuit 322 includes only N2(1), accordingly N2(1) is coupled between rails 214 and 216, rather than between rail 214 and node 319(1). In some embodiments, self-bias circuit 322 includes N2(1), N2(2) and one or more diode-configured MOSFETs coupled in series.

As shown in FIG. 3A, each of N2(1) and N2(2) is an NFET. Also as shown in FIG. 3A, each of N2(1) and N2(2) is coupled with an orientation 324A. In FIG. 3A, relative to NFET N2(1), according to orientation 324A, each of the gate and drain terminals of N2(1) is coupled to node 218 and the source terminal of N2(1) is coupled to node 319(1) in a diode configuration. In some embodiments, the adjective "self" as applied to bias circuit 322 refers to an effect of the diode configuration of each of N2(1) and N2(2), which results in each of N2(1) and N2(2) correspondingly biasing itself. A voltage drop across self-bias circuit 322 is V_bs, where V_bs is the sum of the voltage drop across N2(1) and the voltage drop across N2(2).

Figure 3F:
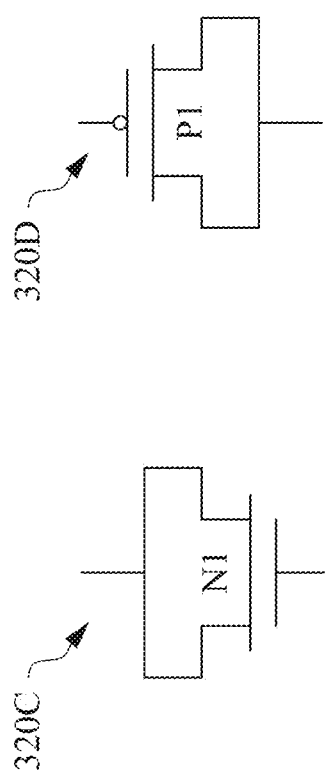

In some embodiments, each of NFETs N2(1) and N2(2) instead is a corresponding P-type MOSFET (PFET) P2(1) and P2(2) (not shown). In some embodiments, each of P2(1) and P2(2) has an orientation 324F shown in FIG. 3F. In FIG. 3F, relative to P2(1), according to orientation 324F, the source terminal of P2(1) is coupled to node 218 and each of the gate and drain terminals of P2(1) is coupled to node 319(1).

Figure 3G:
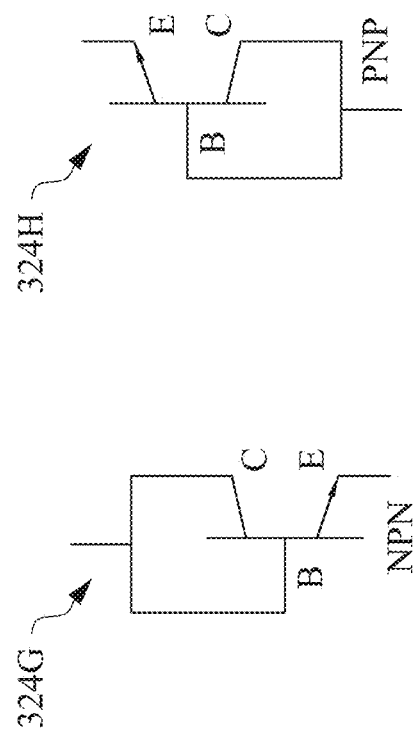
Figure 3H:
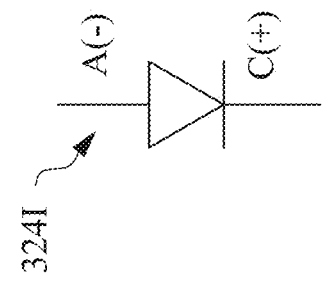

In some embodiments, each of NFETs N2(1) and N2(2) instead is a corresponding bipolar junction transistor (BJT) BJT2(1) and BJT2(2) (not shown). In some embodiments, each of BJT2(1) and BJT2(2) has an orientation 324G shown in FIG. 3G. In FIG. 3G, relative to BJT2(1) (not shown), according to orientation 324G, each of the base and collector terminals of BJT2(1) is coupled to node 218 and the emitter terminal of BJT2(1) is coupled to node 319(1). In some embodiments, each of BJT2(1) and BJT2(2) has an orientation 324H shown in FIG. 3H. In FIG. 3H, relative to BJT2(1) (not shown), according to orientation 324H, the emitter terminal of the BJT BJT2(1) is coupled to node 218 and each of the base and collector terminals of BJT2(1) is coupled to node 319(1).

Figure 3I:
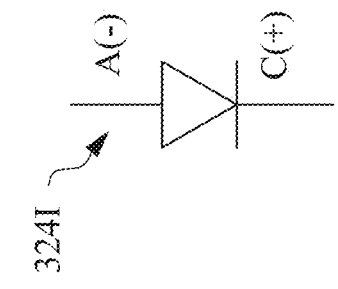
Figure 3J:
Figure 3K:
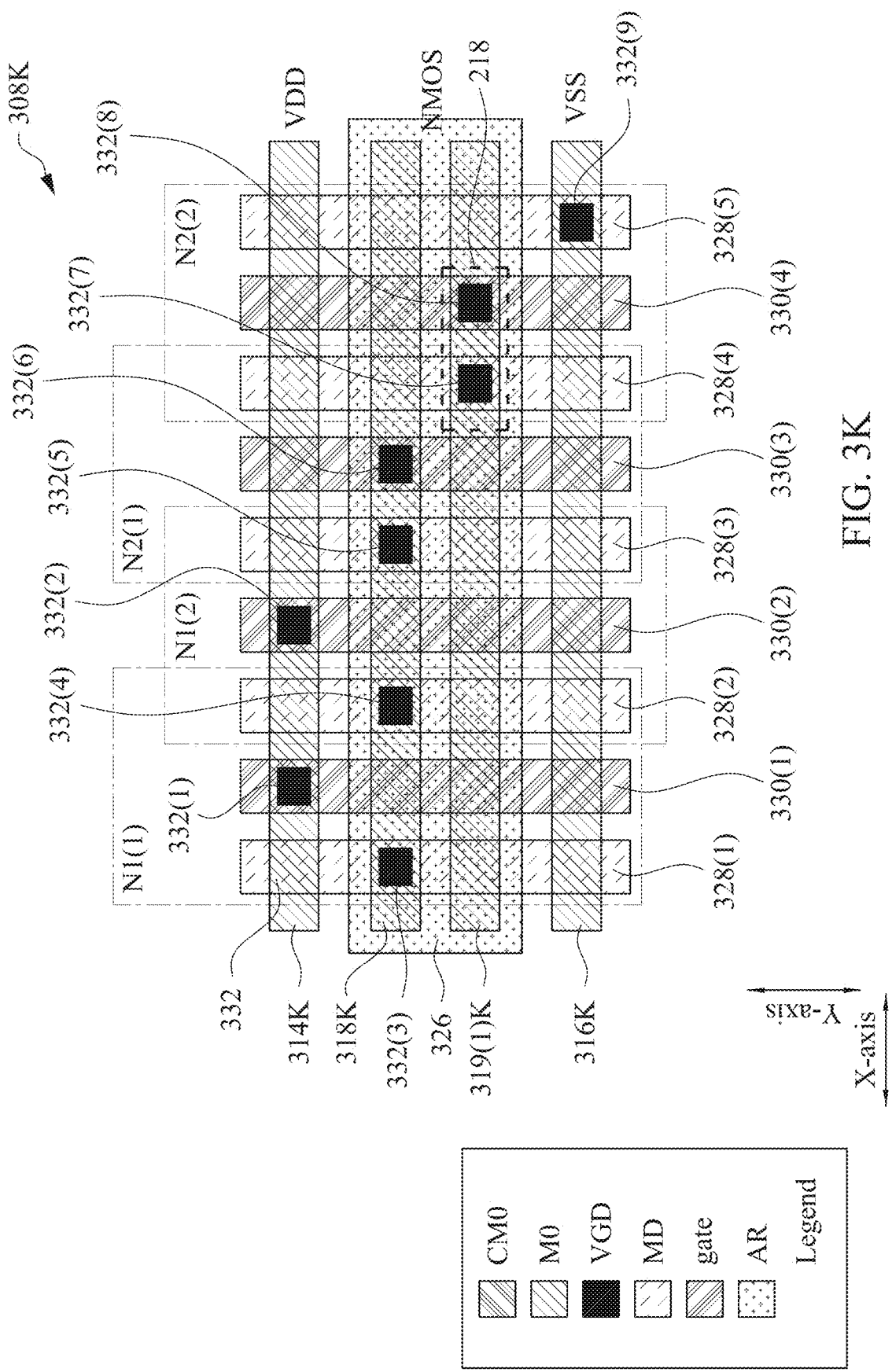
FIG. 3K is a layout diagram, in accordance with some embodiments.

In some embodiments, each of NFETs N2(1) and N2(2) instead is a corresponding diode D1 and D2 (not shown). In some embodiments, each of the diodes has an orientation 324I shown in FIG. 3I. In FIG. 3I, relative to D1 (not shown), according to orientation 324I, the anode of D1 is coupled to node 218 and the cathode of D1 is coupled to node 319(1). In some embodiments, each of NFETs N2(1) and N2(2) instead is a corresponding passive resistor as in FIG. 3J.

In some embodiments, decap system 308A is used in general, low-frequency applications. In some embodiments, the capacitance of decap circuit 210 is described in terms of the quality factor, Q. In general, Q represents the efficiency of a capacitor in terms of its rate of energy loss. In general, the higher the capacitor's value of Q, the lower the loss associated with the capacitor. In some embodiments, Q is represented as Q=1/(@CR), where @ is the operating frequency, C is the capacitance of the capacitor, and R is the series resistance of the capacitor. Here, Q is inversely proportional to @ so that as @ increases, Q will decrease. Hence, decap system 308A is used in general, low-frequency applications. For high-frequency applications, see FIGS. 4A-4B and 5A-5B, or the like.

In terms of area consumed (footprint), as compared to the other approach in which the decap circuit is provided between VDD and VSS albeit not in series with a bias circuit, the inclusion of self-bias circuit 322 in series with decap circuit 210 in decap system 308A according to some embodiments results in decap system 308A having a relatively larger footprint. However, typically there will be significantly, if not substantially, more instances of capacitor-configured MOSFETs (e.g., N1(1)) in decap circuit 210 than there are instances of diode-configured MOSFET (e.g., N2(1)) or instances of the like (e.g., FIGS. 3F-2J) in self-bias circuit 322. In some embodiments, only N2(1) is provided in self-bias circuit 322 of decap system 308A whereas many instances of capacitor-configured MOSFETs (e.g., N1(1)) are provided in decap circuit 210 of decap system 308A so that a ratio of the footprint of N2(1), area_N2(1), to the aggregate footprint of the many instances of capacitor-configured MOSFETs, area_N1($x$), is in a range as follows, $\{\approx(1:10^2)\} \leq (\text{area\_N2}(1):\text{area\_N1}(x)) \leq \{\approx(1:10^6)\}$. Accordingly, the increase in footprint due to inclusion of self-bias circuit 322 in decap system 308A is regarded as insignificant. Furthermore, the increase in footprint due to the inclusion of self-bias circuit 322 in decap system 308A is substantially outweighed by the advantages of self-bias circuit 322. Depending upon the number of instances of diode-configured MOSFET (e.g., N2(1)) or instances of the like (e.g., FIGS. 3F-2J) in self-bias circuit 322, in some embodiments, self-bias circuit 322 consumes a current I_322 in a range of ($\approx$1 nA)$\leq$I_322$\leq$($\approx$10 µA), which is as insignificant as compared to a total current consumption of a semiconductor device which includes the one or more functional circuits 202 (see FIGS. 2A-2B) in addition to self-bias circuit 322. Furthermore, the increase in current consumption attributable to the inclusion of self-bias circuit 322 in decap system 308A is substantially outweighed by the advantages of self-bias circuit 322.

In some embodiments, for a gate pitch (see FIG. 3K) less than ($\approx$100 nm), the MOSFETs in decap circuit are bias to the corresponding cutoff region so that substantially no conduction occurs in the channel region. As such, in some embodiments, |Vgs|<|Vth| and |Vgd|<|Vgs|, where Vgs is the voltage between the gate and source terminals, Vgd is the voltage between the gate and drain terminals, and Vth is the threshold voltage.

Regarding FIG. 3B, system 308B of FIG. 3B is similar to system 308A of FIG. 3A. However, the series arrangement of decap circuit 210 and self-bias circuit 322 in FIG. 3B is different than in FIG. 3A. More particularly, in FIG. 3B, self-bias circuit 322 is coupled between the input of decap system 308B and node 218, and decap circuit 210 is coupled between node 218 and the output of decap system 308B.

Regarding FIG. 3K, layout diagram 308K is representative of a semiconductor device. More particularly, layout diagram 308K is representative of decap system 308A of FIG. 3A.

As such, individual shapes (also known as patterns) in layout diagram 308K are representative of individual structures in the semiconductor device represented by layout diagram 308K. For simplicity of discussion, elements in layout diagram 308K will be referred to as if they are structures rather than shapes per se. For example, each of elements 330(1)-330(4) in layout diagram 308K is a gate shape which represents an instance of gate structure in a corresponding semiconductor device. In the following discussion, shapes 330(1)-330(4) of layout diagram 308K are referred to as corresponding gate structures 330(1)-330(4) rather than as corresponding gate shapes 330(1)-330(4). Also, for example, element 326 in layout diagram 308K is a shape which represents an active region in a corresponding semiconductor device. In the following discussion, element 326 of layout diagram 308K is referred to as active region 326 rather than as active area shape 326.

In FIG. 3K, layout diagram 308K includes: active region 326 (as noted); metal-to-drain/source (MD) contact structures 328(1)-328(5); and gate structures 330(1)-330(4) (as noted). Active region 326 has a long axis of symmetry which extends in first direction. In FIG. 3K, the first direction is substantially parallel to the X-axis. In some embodiments, FIG. 3K is configured for finFET technology such that, e.g., active region 326 represents a fin. In some embodiments, active region 326 is configured for nano wire transistor technology. In some embodiments, active region 326 is configured for nano sheet transistor technology. In some embodiments, active region 326 is configured for planar transistor technology.

Relative to the X-axis, MD contact structures 3281(1)-328(5) and gate structures 330(1)-330(4) are interspersed and non-overlapping of each other. Long axes of symmetry of each of MD contact structures 328(1)-328(5) and gate structures 330(1)-330(4) extend in a second direction substantially perpendicular to the first direction. In FIG. 3K, the second direction is substantially parallel to the Y-axis. In some embodiments, the first and second directions are perpendicular directions other than the corresponding directions of the X-axis and the Y-axis.

Each of MD contact structures 328(1)-328(5) and gate structures 330(1)-330(4) is over a corresponding portion of active region 326. More particularly, in FIG. 3K and relative to the X-axis: gate structure 330(1) is between MD contact structures 328(1) and 328(2); gate structure 330(2) is between MD contact structures 328(2) and 328(3); gate structure 330(3) is between MD contact structures 328(3) and 328(4); and gate structure 330(4) is between MD contact structures 328(4) and 328(5).

Layout diagram 308K further includes via-to-gate/MD (VGD) structures 332(1)-332(9) and M0 segments 314K, 318K, 319(1) K and 316K. VGD structures 332(1)-332(9) are over corresponding ones of MD contact structures 328(1)-328(5) and gate structures 330(1)-330(4).

M0 segments 314K, 318K, 319(1) K and 316K are over corresponding portions of MD contact structures 328(1)-328(5) and gate structures 330(1)-330(4). Corresponding portions of M0 segments 314K, 318K, 319(1) K and 316K are over VGD structures 332(1)-332(9).

In FIG. 3K, M0 segments 314K, 318K, 319(1) K and 316K are in a first layer of metallization (M_1st layer) and have long axes of symmetry that extend substantially in the first direction. Layout diagram 308K assumes a corresponding semiconductor process technology node which includes various design rules for generating a layout diagram. Layout diagram 308K further assumes that the design rules follow a numbering convention in which a first level of metallization (M_1st layer) and a corresponding first level of interconnect structures (V_1st layer) (not shown) are referred to correspondingly as M0 and V0. In some embodiments, the numbering convention assumes that the M_1st level and the V_1st level are referred to correspondingly as MI and VI, and so segments 314K, 318K, 319(1) K and 316K would be referred to as MI segments.

M0 segment 314K corresponds to rail 214 in FIG. 3A, and so M0 segment 314K provides voltage VDD. The portion of M0 segment 318K overlying VGD structures 332(7) and 332(8) corresponds to node 218 in FIG. 3A. M0 segment 319(1) K corresponds to node 319(1) in FIG. 3A. M0 segment 316K corresponds to rail 216 in FIG. 3A, and so M0 segment 316K provides voltage VSS.

Regarding VGD structures 332(1)-332(9) in FIG. 3K, more particularly, VGD structure 332(1) is located at the intersection of M0 segment 314K and gate structure 330(1). VGD structure 332(2) is located at the intersection of M0 segment 314K and gate structure 330(2). VGD structure 332(3) is located at the intersection of M0 segment 318K and MD contact structure 328(1). VGD structure 332(4) is located at the intersection of M0 segment 318K and MD contact structure 328(2). VGD structure 332(5) is located at the intersection of M0 segment 318K and MD contact structure 328(3). VGD structure 332(6) is located at the intersection of M0 segment 318K and gate structure 328(3). VGD structure 332(7) is located at the intersection of M0 segment 319(1) K and MD contact structure 328(4). VGD structure 332(8) is located at the intersection of M0 segment 319(1) K and gate structure 328(4). VGD structure 332(9) is located at the intersection of M0 segment 316K and MD contact structure 328(5).

In FIG. 3K, together, VGD structures 332(1), 332(3) and 332(4), MD contact structures 328(1) and 328(2), gate structure 330(1) and the corresponding portion or active region 326 represent N1(1) of FIG. 3A. Together, VGD structures 332(2), 332(5) and 332(6), MD contact structures 328(2) and 328(3), gate structure 330(2) and the corresponding portion or active region 326 represent N1(2) of FIG. 3A. Together, VGD structures 332(5), 332(6) and 332(7), MD contact structures 328(3) and 328(4), gate structure 330(3) and the corresponding portion or active region 326 represent N2(1) of FIG. 3A. Together, VGD structures 332(7), 332(8) and 332(9), MD contact structures 328(4) and 328(5), gate structure 330(4) and the corresponding portion or active region 326 represent N2(2) of FIG. 3A.

FIG. 3K assumes that active region 326 is configured for NMOS technology. In some embodiments, active region 326 is configured for PMOS technology. In some embodiments in which active region 326 is configured for PMOS technology: M0 segment 314K corresponds to rail 216 in FIG. 3A, and so M0 segment 314K provides voltage VSS; and M0 segment 316K corresponds to rail 214 in FIG. 3A, and so M0 segment 316K provides voltage VDD.

Figure 4A:
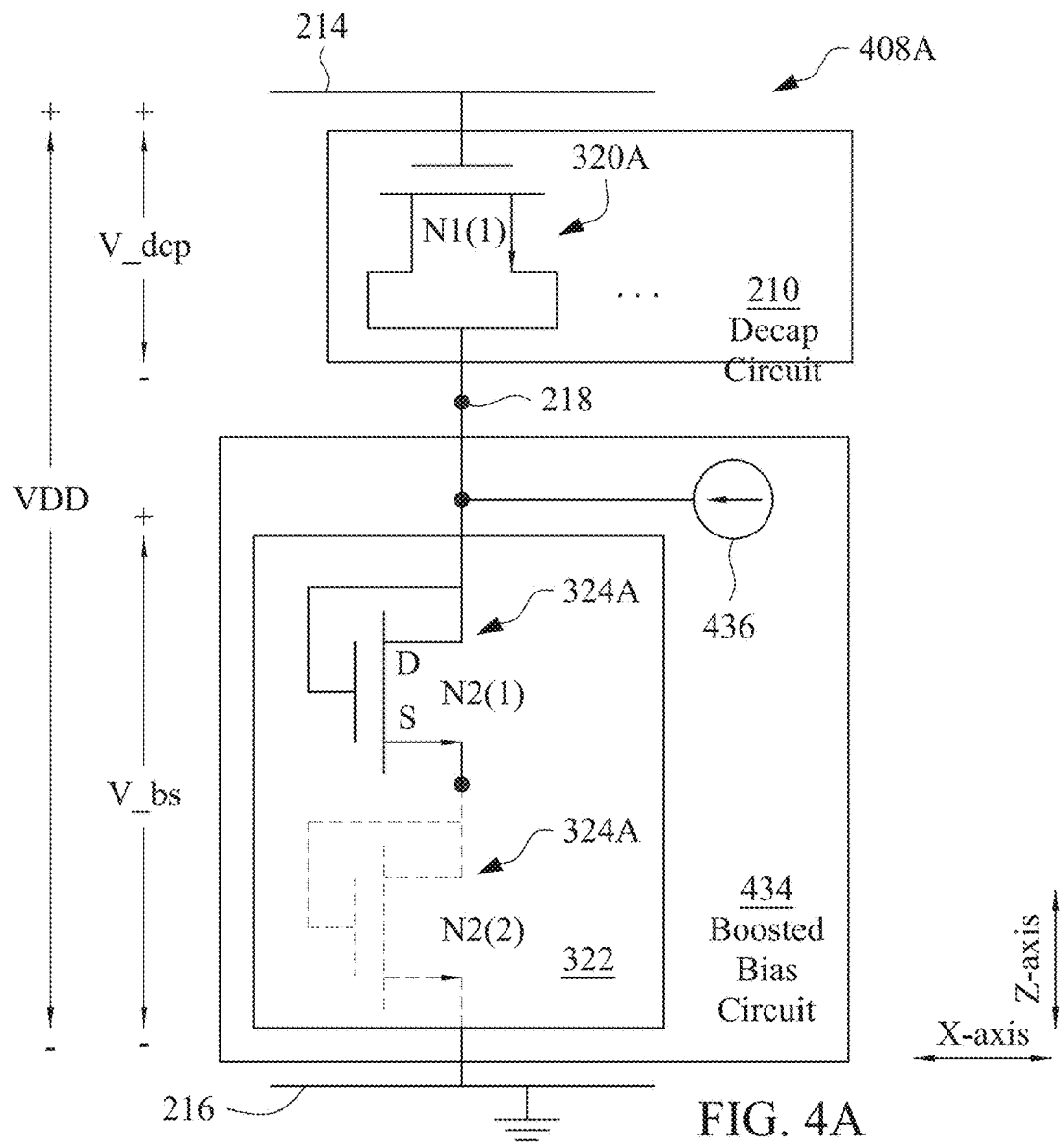
Figure 4B:
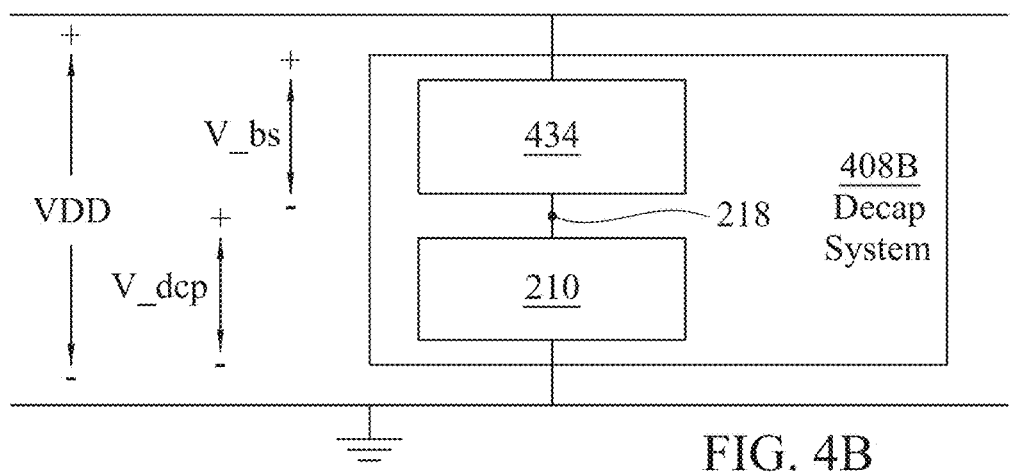

FIG. 4A is a circuit diagram of a decap system 408A, in accordance with some embodiments. FIG. 4B is a block diagram of a decap system 408B, in accordance with some embodiments. FIGS. 4C-4G are corresponding circuit diagrams, in accordance with some embodiments.

FIGS. 4A-4G follow a similar numbering scheme to that of FIGS. 3A-3K. Though corresponding, some components also differ. To help identify components which correspond but nevertheless have differences, the numbering convention uses 4-series numbers for FIGS. 4A-4G while the numbering convention for FIGS. 3A-3K uses 3-series numbers. For example, item 408A in FIG. 4A is a decap system and corresponding item 308A in FIG. 3A is a decap system, and wherein: similarities are reflected in the common root _08A; and differences are reflected in the corresponding leading digit 4 in FIG. 4A and 3 in FIG. 3A. For brevity, the discussion will focus more on differences between FIGS. 4A-4G and FIGS. 3A-3K than on similarities.

Whereas each of FIGS. 3A-3B includes a self-bias circuit 322, FIG. 4A includes a boosted bias circuit 434, which includes self-bias bias circuit 322 of FIG. 3A. Accordingly, boosted bias circuit 434 has at least the same advantages as those of self-bias circuit 322 discussed above.

In FIG. 4A, decap circuit 210 is shown with MOSFETs having orientation 320A, which is the same orientation as shown in FIG. 3A. Similarly to FIG. 3A, in some embodiments, MOSFETs in decap circuit 210 have alternative orientations as variously shown in FIGS. 3C-3E.

In FIG. 4A, boosted bias circuit 434 includes self-bias circuit 322 of FIG. 3A and a bias-current generator 436, the latter providing a positive boost current that flows into node 218 in order to boost the voltage drop across boosted bias circuit 434. The current through boosted bias circuit 434, I_434, is equal to the current through decap circuit 210, I_210, plus the boost current, I_436, such that I_434=I_210+I_436. As a result, a total amount of current passing from node 218 through boosted bias circuit 434 to rail 216 in FIG. 4A is greater than a total amount of current passing from node 218 through self-bias circuit 322 to rail 216 in FIG. 3A. For low-frequency applications, an effect of the increased current through boosted bias circuit 434 is that the voltage drop across boosted bias circuit 434, V_bs_434, is greater than the voltage drop across self-bias circuit 322 in FIG. 3A, V_bs_322, such that V_bs_434>V_bs_322 without having to increase the size N2(1).

For low-frequency applications, assuming that the difference between V_bs_322 and V_bs_434 is represented by ΔV, where ΔV is a positive voltage, the relation between V_bs_322 and V_bs_434 is represented by a third equation, $$V\_bs\_434 = V\_bs\_322 + \Delta V.$$

Letting VDD=V_408A in FIG. 4A and VDD=V_308A in FIG. 3A such that VDD=V_408A=V_308A, and rewriting the second equation for VDD and substituting accordingly yields a fourth equation, $$V\_dcp\_408A + V\_bs\_436 = V\_dcp\_308A + V\_bs\_322.$$

Substituting the third equation into the fourth equation yields a fifth equation, $$V\_dcp\_408A = V\_dcp\_308A - \Delta V.$$

Based on the fifth equation, V_dcp_408A<V_dcp_308A. Comparing the protective effects of boosted bias circuit 434 in FIG. 4A and self-bias circuit 322 in FIG. 3A, one or more thin oxide MOSFETs in decap circuit 210 of decap system 408A are even less susceptible to breakdown of the thin gate oxide and/or current leakage as compared to one or more MOSFETs of decap circuit 210 of decap system 308A because V_dcp_408A<V_dcp_308A.

In some embodiments, decap system 408A is used for high-frequency applications. In some embodiments, high frequencies are frequencies equal to or greater than about 1 GHz. In some embodiments, low frequencies are frequencies less than about 1 GHz. Recalling that, in general, Q represents the efficiency of a capacitor in terms of its rate of energy loss, and that as the capacitor's value of Q increases then loss associated with the capacitor decreases, a high-frequency application reduces the value of Q and thus increases the loss associated with the capacitor. Accordingly, without bias-current generator 436, high frequencies would cause the voltage drop, V_dcp_408A, across decap circuit 210 in decap system 408A to be greater than it would be otherwise for low frequencies, where the circumstances of low frequencies corresponds to the circumstances in FIG. 3A and the corresponding voltage drop, V_dcp_308A, across decap circuit 210 in decap system 308A. To offset what otherwise would be an increase in V_dcp_408A due to high frequencies, the voltage drop across boosted bias circuit 434, V_bs_436, is increased (boosted) due to the boost current provided by bias-current generator 436. As a result, V_dcp_408A is lower than the voltage drop, V_other, across the decap circuit according to the other approach, where (again) the other approach provides a decap circuit corresponding to decap circuit 210 between VDD and VSS albeit not in series with a bias circuit. Accordingly, an advantage of decap system 408A is that one or more thin oxide MOSFETs in decap circuit 210 have an advantage of being less susceptible to breakdown of the thin gate oxide and/or current leakage as compared to one or more MOSFETs in the decap circuit according to the other approach because V_dcp_408A is less than VDD, whereas V_other=VDD according to the other approach.

Regarding FIG. 4B, system 408B of FIG. 4B is similar to system 408A of FIG. 4A. However, the series arrangement of decap circuit 210 and boosted bias circuit 434 in FIG. 4B is different than in FIG. 4A. More particularly, in FIG. 4B, boosted bias circuit 434 is coupled between the input of decap system 408B and node 218, and decap circuit 210 is coupled between node 218 and the output of decap system 408B.

Example versions of bias-current generator 436 are shown correspondingly as current sources 436C-436G of corresponding FIGS. 4C-4G, in accordance with some embodiments.

In FIG. 4C, current source 436C is an NFET N10 in which a source terminal of N10 represents an output of current source 436C. Accordingly, the source terminal of N10 is coupled to node 218 in FIG. 4C.

In FIG. 4D, current source 436D is current mirror which includes NFETs N10, N12 and N14. A gate terminal of N10 is coupled to a voltage Vbias. Each of a source terminal of N10, a gate terminal of N12, and a drain terminal of N14 is coupled to a node 438(1). Each of a source terminal of N12, a gate terminal of N14, and an input of an extra current source 439(1) is coupled to a node 438(2). A source terminal of N14 represents an output of current source 436D, and so the source terminal of N14 is coupled to node 218 in FIG. 4D.

In FIG. 4E, current source 436E is current mirror which includes NFETs N10, N14, N16 and N18. Each of gate terminal of N10, a gate terminal of N16, a source terminal of N16 and a drain terminal of N18 is coupled to a node 438(3). Each of a source terminal of N10 and a drain terminal of N14 is coupled to node 438(1). Each of a gate terminal of N18, a source terminal of N18, a gate terminal of N14, and an input of an extra current source 439(2) is coupled to a node 438(4). A source terminal of N14 represents an output of current source 436E, and so the source terminal of N14 is coupled to node 218 in FIG. 4E.

In FIG. 4F, current source 436F is current mirror which includes NFETs N10, N14, N16 and N20. Each of a source terminal of N10 and a drain terminal of N14 is coupled to node 438(1). Each of a source terminal of N16 and a drain terminal of N20 is coupled to a node 438(5). Each of gate terminal of N10, a gate terminal of N16, a source terminal of N20 and an input of an extra current source 439(3) is coupled to a node 438(6). Each of a gate terminal of N20 and a gate terminal of N14 is coupled to the voltage Vbias. A source terminal of N14 represents an output of current source 436F, and so the source terminal of N14 is coupled to node 218 in FIG. 4F.

In FIG. 4G, current source 436G is current driver which includes NFET N10 and an operational amplifier (op amp) 440. A non-inverting input of op amp 440 is coupled to the voltage Vbias. An inverting input is coupled to a source terminal of N14, where the source terminal of N14 represents an output of current source 436F. Accordingly, the source terminal of N14 is coupled to node 218 in FIG. 4G.

Figure 5A:
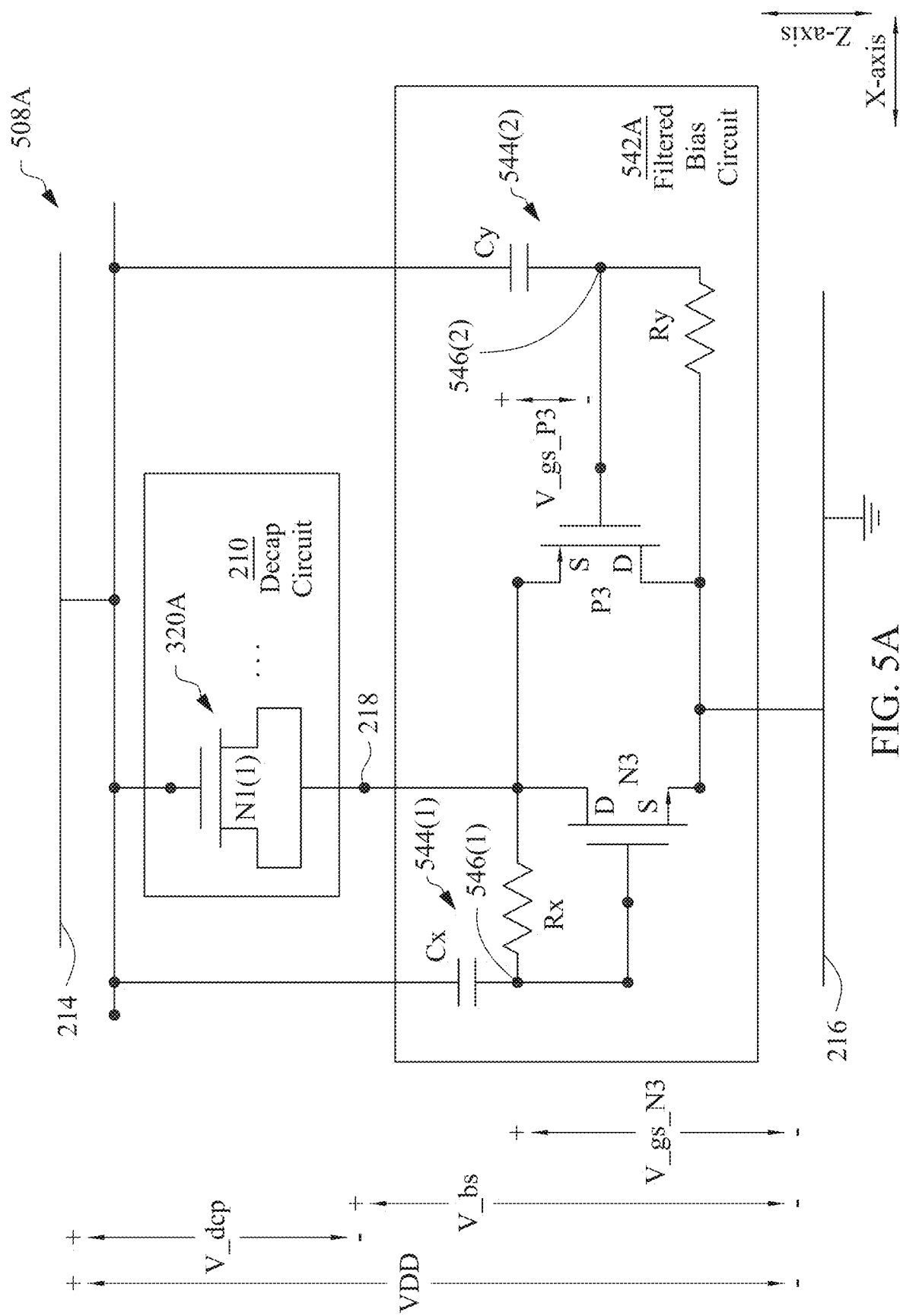
FIGS. 5A-5B are corresponding circuit diagrams, in accordance with some embodiments.
Figure 5B:
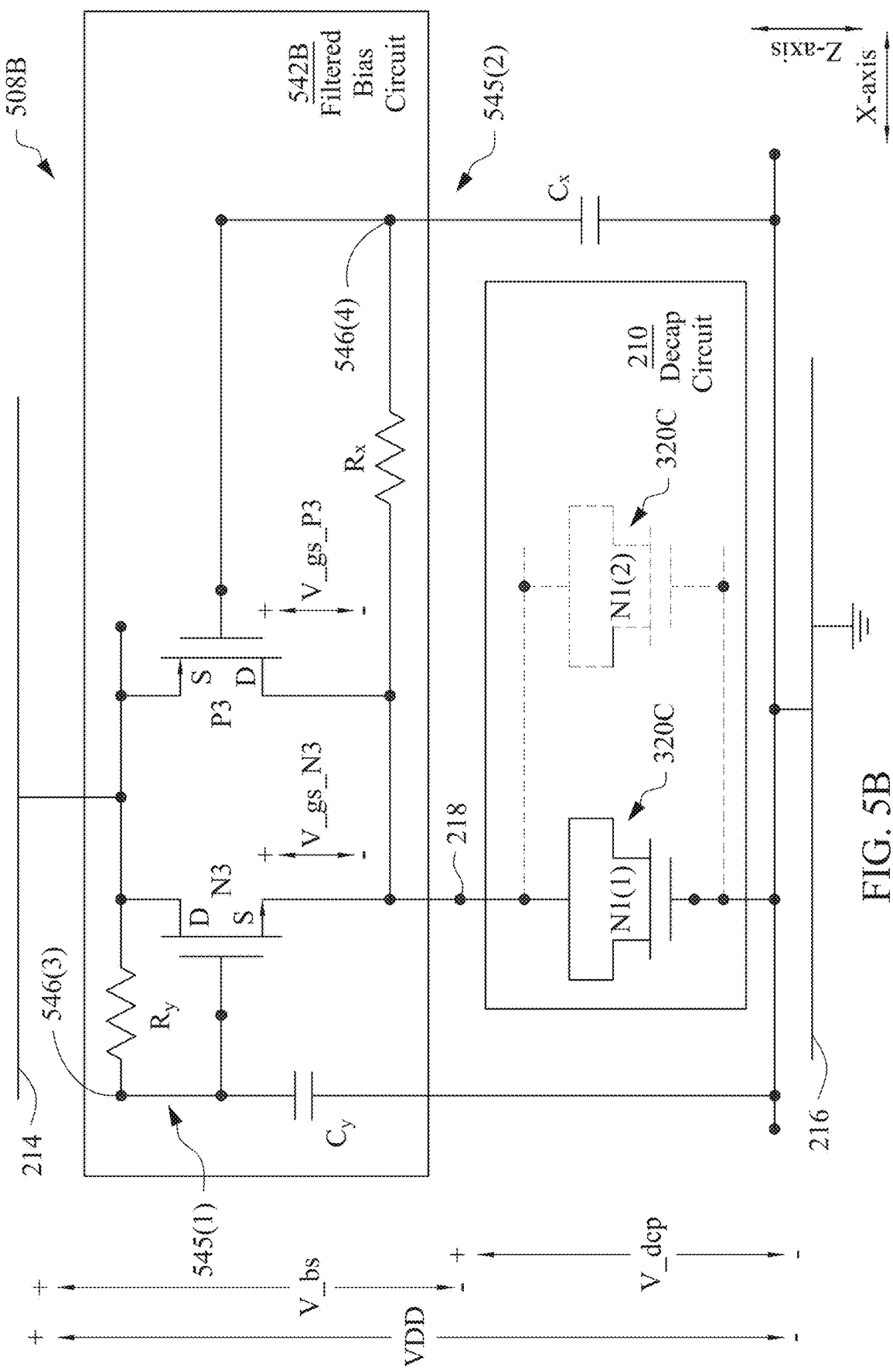

FIG. 5A is a circuit diagram of a decap system 508A, in accordance with some embodiments. FIG. 5B is a block diagram of a decap system 508B, in accordance with some embodiments.

FIGS. 5A-5B follow a similar numbering scheme to that of FIGS. 3A-3K. Though corresponding, some components also differ. To help identify components which correspond but nevertheless have differences, the numbering convention uses 5-series numbers for FIGS. 5A-5B while the numbering convention for FIGS. 3A-3K uses 3-series numbers. For example, item 508A in FIG. 5A is a decap system and corresponding item 308A in FIG. 3A is a decap system, and wherein: similarities are reflected in the common root _08A; and differences are reflected in the corresponding leading digit 5 in FIG. 5A and 3 in FIG. 3A. For brevity, the discussion will focus more on differences between FIGS. 5A-5B and FIGS. 3A-3K than on similarities.

Whereas each of FIGS. 3A-3B includes a self-bias circuit 322, FIG. 5A includes a filtered bias circuit 542A. Filtered bias circuit 542A is a particular type of bias circuit 212 of FIG. 2A, just as self-bias circuit 322 is a particular type of bias circuit 212. Accordingly, filtered circuit 542A has at least the same advantages as those of bias circuit 212 discussed above.

Regarding FIG. 5A, decoupling system 508A has a series arrangement of decap circuit 210 and filtered bias circuit 542A coupled between rails 214 and 216. More particularly, decap circuit 210 is coupled between rail 214 and node 218, and filtered bias circuit 542A is coupled between node 218 and rail 216.

In FIG. 5A, decap circuit 210 is shown with MOSFETs having orientation 320A, which is the same orientation as shown in FIG. 3A. Similarly to FIG. 3A, in some embodiments, MOSFETs in decap circuit 210 of decap system 508A have alternative orientations as variously shown in FIGS. 3C-3E.

In FIG. 5A, filtered bias circuit 542A includes: an NFET N3; a PFET P3; a high pass filter 544(1) and a high pass filter 544(2). In FIG. 5A, N3 and P3 are coupled in parallel between node 218 and rail 216.

High pass filter 544(1) of filtered bias circuit 542A includes a capacitor Cx and a resistor Rx coupled in series between rail 214 and node 218. More particularly, capacitor Cx is coupled between rail 214 and a first filtered bias circuit node 546(1), and resistor Rx is coupled between first filtered bias circuit node 546(1) and node 218. A gate terminal of N3 is coupled to first filtered bias circuit node 546(1). Positive phases of ripple exhibited by VDD on rail 214 are passed, albeit attenuated, by the high pass filter 544(1) so that a resultant ripple on the gate terminal of N3 is relatively reduced in magnitude. A voltage drop between the gate and source terminals of N3 is shown in FIG. 5A as V_gs_N3.

High pass filter 544(2) of filtered bias circuit 542A includes a capacitor Cy and a resistor Ry coupled in series between rail 214 and rail 216. More particularly, capacitor Cy is coupled between rail 214 and a second filtered bias circuit node 546(2), and resistor Ry is coupled between second filtered bias circuit node 546(2) and rail 216. A gate terminal of P3 is coupled second filtered bias circuit node 546(2). Negative phases of ripple exhibited by VDD on rail 214 are passed, albeit attenuated, by high pass filter 544(2) so that a resultant ripple on the gate terminal of P3 is relatively reduced in magnitude. A voltage drop between the source and gate terminals of P3 is shown in FIG. 5A as V_gs_P3.

In FIG. 5A, resistors Rx and Ry are correspondingly implementable with an active device which provides resistance, e.g., an NFET, a PFET, a MOSFET transmission gate, or the like, or a passive resistor. Also in FIG. 5A, capacitors Cx and Cy are correspondingly implementable with an active device which provides a capacitance, e.g., a capacitor-configured MOSFET with orientations such as in FIGS. 3A and 3C-3E, or the like, or as a passive capacitor.

In some embodiments, decap system 508A is used for high-frequency applications. Recalling that, in general, Q represents the efficiency of a capacitor in terms of its rate of energy loss, and that as the capacitor's value of Q increases then loss associated with the capacitor decreases, a high-frequency application reduces the value of Q and thus increases the loss associated with the capacitor. Accordingly, without high pass filters 544(1) and 544(2), high frequencies would cause the voltage drop, V_dcp_508A, across decap circuit 210 in decap system 508A to be greater than it would be otherwise for low frequencies, where the circumstances of low frequencies corresponds to the circumstances in FIG. 3A and the corresponding voltage drop, V_dcp_308A, across decap circuit 210 in decap system 308A. To offset what otherwise would be an increase in V_dcp_508A due to high frequency ripple VDD on rail 214, high pass filters 544(1) and 544(2) shunt high frequencies away from decap circuit 210 correspondingly to first filtered bias circuit node 546(1) and second filtered bias circuit node 546(2). As a result, V_dcp_508A is not raised due to the high frequency ripple VDD on rail 214 as otherwise it would be but for high pass filters 544(1) and 544(2). As a result, V_dcp_508A is lower than the voltage drop, V_other, across the decap circuit according to the other approach, where (again) the other approach provides a decap circuit corresponding to decap circuit 210 between VDD and VSS albeit not in series with a bias circuit. Accordingly, an advantage of decap system 808A is that one or more thin oxide MOSFETs in decap circuit 210 have an advantage of being less susceptible to breakdown of the thin gate oxide and/or current leakage as compared to one or more MOSFETs in the decap circuit according to the other approach because V_dcp_508A is less than VDD, whereas V_other=VDD according to the other approach.

Regarding FIG. 5B, decap system 508B is similar to system 508A of FIG. 5A. However, the series arrangement of decap circuit 210 and filtered bias circuit 542B in FIG. 5B is different than in the series arrangement of decap circuit 210 and filtered bias circuit 542A in FIG. 5A. More particularly, in FIG. 5B, filtered bias circuit 542B is coupled between the input of decap system 508B and node 218, and decap circuit 210 is coupled between node 218 and the output of decap system 508B.

In FIG. 5B, decap circuit 210 is shown with MOSFETs having orientation 320C as in FIG. 3C. In some embodiments, MOSFETs in decap circuit 210 of decap system 508B have alternative orientations as variously shown in FIGS. 3A and 3D-3E.

In FIG. 5B, filtered bias circuit 542B includes: NFET N3; PFET P3; a low pass filter 545(1) and a low pass filter 545(2). In FIG. 5A, N3 and P3 are coupled in parallel between rail 214 and node 218.

Low pass filter 545(1) includes resistor Ry and capacitor Cy coupled in series between rail 214 and rail 216. More particularly, resistor Ry is coupled between rail 214 and a first filtered bias circuit node 546(3), and capacitor Cy is coupled between first filtered bias circuit node 546(3) and rail 216. A gate terminal of N3 is coupled to first filtered bias circuit node 546(3). Positive phases of ripple exhibited by VSS on rail 216 are passed, albeit attenuated, by the low pass filter 545(1) so that a resultant ripple on the gate terminal of N3 is relatively reduced in magnitude. A voltage drop between the gate and source terminals of N3 is shown in FIG. 5B as V_gs_N3.

Low pass filter 545(2) includes resistor Rx and capacitor Cx coupled in series between node 218 and rail 216. More particularly, resistor Rx is coupled between node 218 and a second filtered bias circuit node 546(4), and capacitor Cx is coupled between second filtered bias circuit node 546(4) and rail 216. A gate terminal of P3 is coupled second filtered bias circuit node 546(4). Negative phases of ripple exhibited by VSS on rail 216 are passed, albeit attenuated, by low pass filter 545(2) so that a resultant ripple on the gate terminal of P3 is relatively reduced in magnitude. A voltage drop between the source and gate terminals of P3 is shown in FIG. 5B as V_gs_P3.

In some embodiments, decap system 508A is used for high-frequency applications. Recalling that, in general, Q represents the efficiency of a capacitor in terms of its rate of energy loss, and that as the capacitor's value of Q increases then loss associated with the capacitor decreases, a high-frequency application reduces the value of Q and thus increases the loss associated with the capacitor. Relative to rail 214, filters 545(1) and 545(2) are low pass filters. Relative to rail 216, low pass filters 545(1) and 545(2) as high pass filters. Accordingly, without low pass filters 545(1) and 545(2) and their associated high-pass-filtering behavior towards rail 216, high frequencies on rail 216 would cause the voltage drop, V_dcp_508B, across decap circuit 210 in decap system 508B to be greater than it would be otherwise for low frequencies, where the circumstances of low frequencies corresponds to the circumstances in FIG. 3A and the corresponding voltage drop, V_dcp_308A, across decap circuit 210 in decap system 308A. To offset what otherwise would be an increase in V_dcp_508B due to high frequency ripple in VSS on rail 216, the high-pass-filtering behavior towards rail 216 exhibited by low pass filters 545(1) and 545(2) shunt high frequencies away from decap circuit 210 correspondingly to first filtered bias circuit node 546(3) and second filtered bias circuit node 546(4). As a result, V_dcp_508B is not raised due to high frequency ripple in VSS on rail 216 as otherwise it would be but for low pass filters 545(1) and 545(2). As a result, V_dcp_508B is lower than the voltage drop, V_other, across the decap circuit according to the other approach, where (again) the other approach provides a decap circuit corresponding to decap circuit 210 between VDD and VSS albeit not in series with a bias circuit. Accordingly, an advantage of decap system 508A is that one or more thin oxide MOSFETs in decap circuit 210 have an advantage of being less susceptible to breakdown of the thin gate oxide and/or current leakage as compared to one or more MOSFETs in the decap circuit according to the other approach because V_dcp_508B is less than VDD, whereas V_other=VDD according to the other approach.

Figure 6:
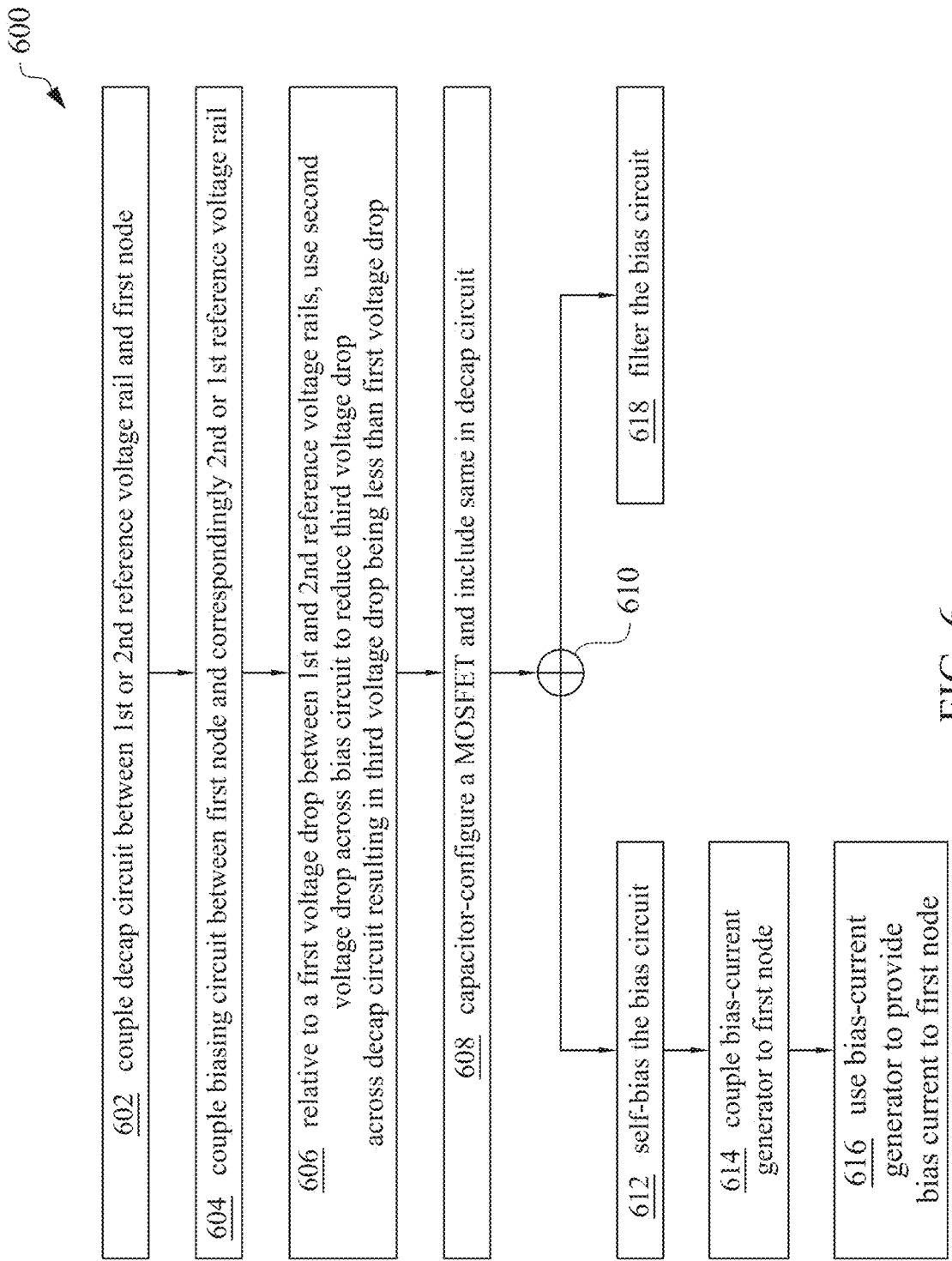
FIGS. 6, 7 and 8A-8B are corresponding flowcharts, in accordance with some embodiments.

FIG. 6 is a flowchart of a method 600 of decoupling voltage variations, in accordance with some embodiments.

In some embodiments, method 600 represents the operation of decap systems of FIGS. 1A-1C, 2A-2B, 3A-3B, 4A-4B, 5A-5B, or the like.

The flowchart of FIG. 6 includes blocks 602-618. At block 602, a decap circuit is coupled between a first or second reference voltage rail and a first node. Examples of the first and second reference voltage rails are corresponding rails 214 and 216 in FIGS. 2A-2B, 3A-3B, 4A-4B, 5A-5B, or the like. An example of the first node is node 218 in FIGS.

2A-2B, 3A-3B, 4A-4B, 5A-5B, or the like. An example of the decap circuit being coupled between the first reference voltage rail and the first node is the arrangement of decap circuit 210 in FIGS. 2A, 3A, 4A, 5A, or the like. An example of the decap circuit being coupled between the second reference voltage rail and the first node is the arrangement of decap circuit 210 in FIGS. 2B, 3B, 4B, 5B, or the like. From block 602, flow proceeds to block 604.

At block 604, a biasing circuit is coupled between the first node and correspondingly the second or first reference voltage rail. Where the decap circuit is coupled to the first reference voltage rail, an example of the biasing circuit being coupled between the first node and the second voltage reference rail is the arrangement of bias circuit 212 in FIG. 2A, self-bias circuit 322 in FIG. 3A, boosted bias circuit 434 in FIG. 4A, filtered bias circuit 542A in FIG. 5A, or the like. Where the decap circuit is coupled to the second reference voltage rail, an example of the biasing circuit being coupled between the first node and the first voltage reference rail is the arrangement of bias circuit 212 in FIG. 2B, self-bias circuit 322 in FIG. 3B, boosted bias circuit 434 in FIG. 4B, filtered bias circuit 542B in FIG. 5B, or the like. From block 604, flow proceeds to block 606.

At block 606, relative to a first voltage drop between the first and second reference voltage rails, a second voltage drop across the bias circuit is used to reduce a third voltage drop across the decap circuit, with a result that the third voltage drop is less than the first voltage drop. Examples of the first, second and third voltage drops are correspondingly VDD, V_bs and V_dcp in each of FIGS. 2A-2B, 3A-3B, 4A-4B, 5A-5B, or the like. Each of FIGS. 2A-2B, 3A-3B, 4A-4B, 5A-5B, or the like, is an example of using the second voltage drop (V_bs) to reduce the third voltage drop (V_dcp). Accordingly, as a result, in each of FIGS. 2A-2B, 3A-3B, 4A-4B, 5A-5B, or the like, the third voltage drop (V_dcp) is less than the first voltage drop (VDD). From block 606, flow proceeds to block 608.

At block 608, a MOSFET is configured as a capacitor (capacitor-configured) and the same is included in the decap circuit. Examples of the decap circuit including capacitor-configured MOSFETs include NFET N (1) in decap circuit 210 in each of FIGS. 3A, 4A, 5A-5B, or the like. From block 608, flow proceeds to block 610.

Block 610 is a disjunctive block, which is alternatively referred to as on OR block. At block 610, flow proceeds to either block 612 or to block 618.

If flow proceeds to block 612, then (at block 612) the bias circuit is self-biased. An example of self-biasing the bias circuit is in the operation of self-bias circuit 322 of FIGS. 3A-3B. From block 612, flow proceeds to block 614.

At block 614, a bias-current is coupled to the first node. An example of coupling a bias current generator to the first node is boosted bias circuit 434 in each of FIGS. 4A-4B. In boosted bias circuit 434 of FIG. 4A, bias-current generator 436 (shown in FIG. 4A albeit not in FIG. 4B) is coupled to node 218 so bias-current generator 436 is an example of the bias current generator. From block 614, flow proceeds to block 616.

At block 616, a bias-current generator is used to provide bias current to the first node in order to boost the voltage drop across boosted bias circuit. In operation, bias-current generator 436 provides current to node 218 and so bias-current generator 436 is an example of using the bias-current generator to provide bias current to the first node.

If flow proceeds to block 618, then (at block 618) the bias circuit is filtered. An example filtering the bias circuit is the operation of filtered bias circuit 542A of FIG. 5A, which includes high pass filters 544(1)-544(2), the operation of filtered bias circuit 542B of FIG. 5B, which includes low pass filters 545(1)-545(2), or the like. More particularly, in operation, high pass filters 544(1)-544(2) of filtered bias circuit 542A of FIG. 5A filter ripple in VDD. In operation, low pass filters 545(1)-545(2) of filtered bias circuit 542B of FIG. 5B filter ripple in VDD. Accordingly, in corresponding operation, each of high pass filters 544(1)-544(2) and low pass filters 545(1)-545(2) is an example of filtering the bias circuit.

Figure 7:
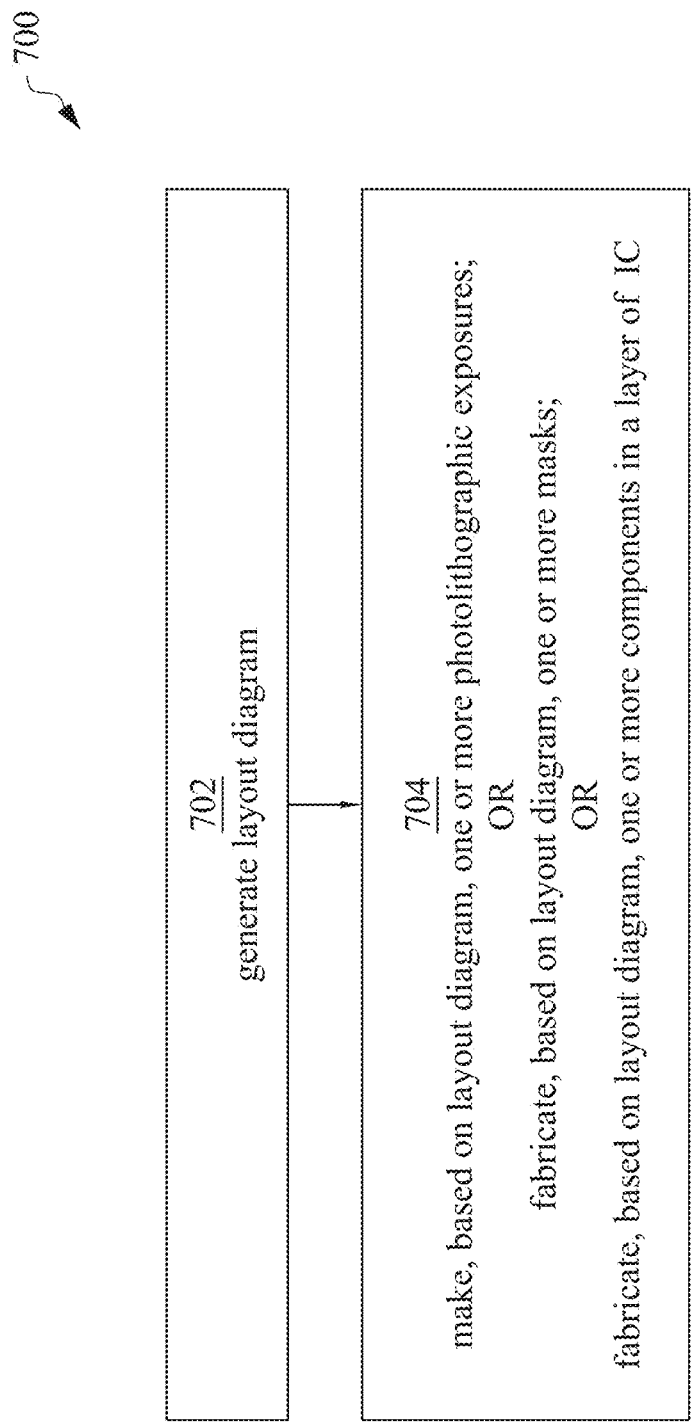

FIG. 7 is a flowchart of a method 700 of manufacturing a semiconductor device, in accordance with some embodiments.

Method 700 is implementable, for example, using EDA system 900 (FIG. 9, discussed below) and an integrated circuit (IC), manufacturing system 1000 (FIG. 10, discussed below), in accordance with some embodiments. Examples of a semiconductor device which can be manufactured according to method 700 include semiconductor devices 100A-100C of corresponding FIGS. 1A-1C, semiconductor devices corresponding to FIGS. 2A-2B, 3A-3B, 3K, 4A-4B, 5A-5B, or the like.

In FIG. 7, method 700 includes blocks 702-704. At block 702, a layout diagram is generated (see FIGS. 8A-8B) which, among other things, includes one or more of layout diagrams disclosed herein, or the like. Block 702 is implementable, for example, using EDA system 900 (FIG. 9, discussed below), in accordance with some embodiments. From block 702, flow proceeds to block 704.

At block 704, based on the layout diagram, at least one of (A) one or more photolithographic exposures are made or (B) one or more semiconductor masks are fabricated or (C) one or more components in a layer of a semiconductor device are fabricated. See discussion below of FIG. 10.

Figure 8A:
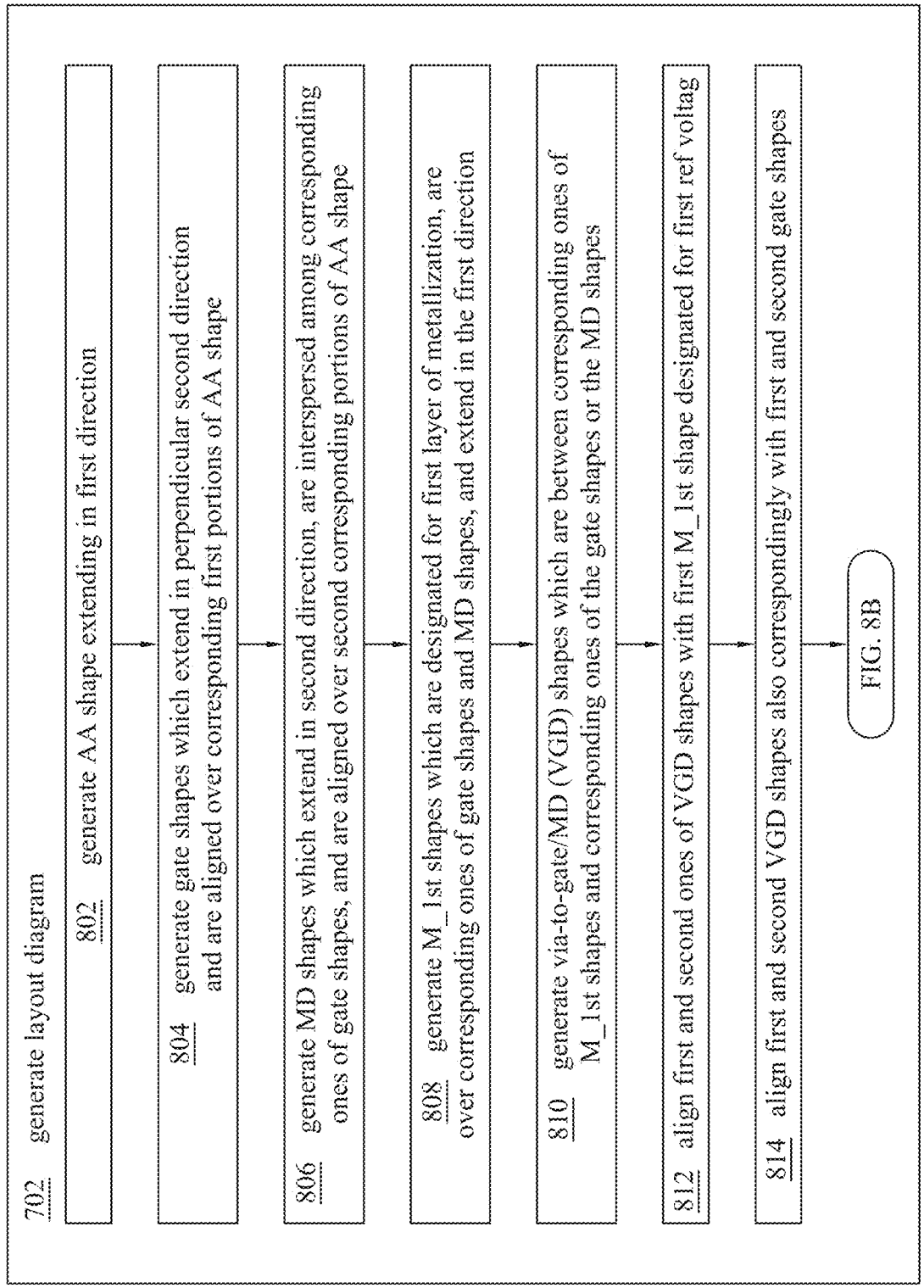
Figure 8B:
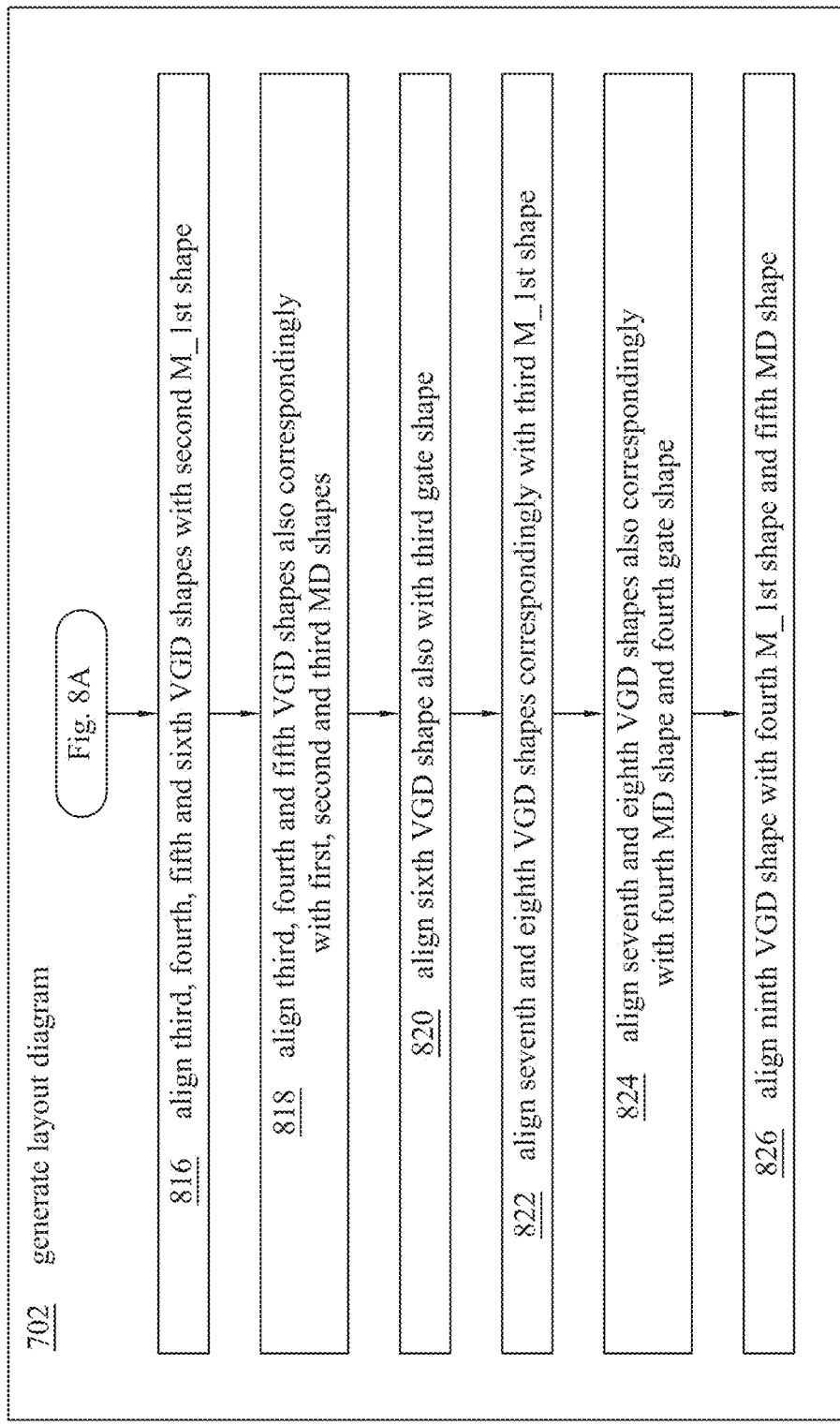

FIGS. 8A-8B are corresponding flowcharts of a method of generating a layout diagram, in accordance with some embodiments.

More particularly, the flowcharts of corresponding FIGS. 8A-8B show additional blocks included in block 702 of FIG. 7, in accordance with one or more embodiments. An example of a layout diagram generated according to the method represented by the flowchart of FIGS. 8A-8B is layout diagram 308K of FIG. 3K.

In FIGS. 8A-8B, the flowchart includes blocks 802-826, with blocks 802-814 being shown in FIG. 8A and blocks 816-826 being shown in FIG. 8B. At block 802 of FIG. 8A, an active area (AA) shape is generated which extends in a first direction. An example of the first direction is the X-axis in FIG. 3K. An example of the AA shape is active region 326 shown in FIG. 3K. From block 802, flow proceeds to block 804.

At block 804, gate shapes are generated which extend in a second direction that is perpendicular to the first direction, and which are aligned over first corresponding portions of the AA shape. An example of the second direction is the Y-axis in FIG. 3K. Examples of the gate shapes are gate structures 330(1)-330(4) in FIG. 3K, or the like, and wherein gate structures 330(1)-330(4) are aligned over first corresponding portions of active region 326, and are non-overlapping of each other. From block 804, flow proceeds to block 806.

At block 806, contact-to-transistor-component shapes (MD shapes) are generated which extend in the second direction, are interspersed among corresponding ones of the gate shapes, and are aligned over second corresponding portions of the AA shape. Examples of the MD shapes are MD contact structures 328(1)-328(5) in FIG. 3K, of the like, wherein MD contact structures 328(1)-328(5) are over second corresponding portions of active region 326, are non-overlapping of each other, and are interspersed with gate structures 330(1)-330(4). From block 806, flow proceeds to block 808.

At block 808, conductor shapes are generated which are designated for a first layer (M_1st) of metallization (M_1st shapes), are over corresponding ones of the gate shapes and the MD shapes, and extend in the first direction. Examples of the M_1st shapes are M0 segments 314K, 318K, 319(1) K and 316K in FIG. 3K, or the like. In FIG. 3K, M0 segments 314K, 318K, 319(1) K and 316K are over corresponding portions of MD contact structures 328(1)-328(5) and gate structures 330(1)-330(4). In FIG. 3K, M0 segment 314K corresponds to rail 214 in FIG. 3A, and so M0 segment 314K provides voltage VDD. In FIG. 3K, M0 segment 316K corresponds to rail 216 in FIG. 3A, and so M0 segment 316K provides voltage VSS. From block 808, flow proceeds to block 810.

At block 810, via-to-gate/MD (VGD) shapes are generated which are between corresponding ones of the M_1st shapes and corresponding ones of the gate shapes or the MD shapes. Examples of the VGD shapes are VGD structures 332(1)-332(9) in FIG. 3K, or the like. In FIG. 3K, VGD structures 332(1)-332(9) are over corresponding ones of MD contact structures 328(1)-328(5) and gate structures 330(1)-330(4); and corresponding portions of M0 segments 314K, 318K, 319(1) K and 316K are over VGD structures 332(1)-332(9). From block 810, flow proceeds to block 812.

At block 812, first and second ones of the VGD shapes are aligned with a first one of the M_1st shapes. An example of the first one of the M_1st shapes is M0 shape 314K in FIG. 3K, or the like. Examples of the first and second ones of the VGD shapes being aligned with a first one of the M_1st shapes are corresponding VGD structures 332(1) and 332(2) in FIG. 3K, or the like. In FIG. 3K, VGD structures 332(1) and 332(2) are aligned over M0 segment 314K. From block 812, flow proceeds to block 814.

At block 814, the first and second VGD shapes are also aligned correspondingly with first and second ones of the gate shapes. Examples of the first and second ones of the gate shapes are gate structures 330(1) and 330(2) of FIG. 3K, or the like. Examples of the first and second VGD shapes also being aligned correspondingly with first and second ones of the gate shapes are corresponding VGD structures 332(1) and 332(2) in FIG. 3K, or the like. In FIG. 3K, VGD structures 332(1) and 332(2) also are correspondingly aligned with gate structures 330(1) and 330(2). From block 814 in FIG. 8A, flow proceeds to block 816 in FIG. 8B.

At block 816, third, fourth, fifth and sixth ones of the VGD shapes are aligned with a second one of the M_1st shapes. An example of the second one of the M_1st shapes is M0 shape 318K in FIG. 3K, or the like. Examples of the third, fourth, fifth and sixth ones of the VGD shapes being aligned with a second one of the M_1st shapes are corresponding VGD structures 332(3), 332(4), 332(5) and 332(6) in FIG. 3K, or the like. In FIG. 3K, VGD structures 332(3), 332(4), 332(5) and 332(6) are aligned over M0 segment 318K. From block 816, flow proceeds to block 818.

At block 818, the third, fourth and fifth VGD shapes are also aligned correspondingly with first, second and third ones of the MD shapes. Examples of the first, second and third ones of the MD shapes are MD structures 328(1), 328(2) and 328(3) in FIG. 3K, or the like. Examples of the third, fourth and fifth VGD shapes also being aligned correspondingly with first, second and third ones of the MD shapes are corresponding VGD structures 332(3), 332(4) and 332(5) in FIG. 3K, or the like. In FIG. 3K, VGD structures 332(3), 332(4) and 332(5) also are correspondingly aligned with MD structures 328(1), 328(2) and 328(3). From block 818, flow proceeds to block 820.

At block 820, the sixth VGD shape is also aligned with a third one of the gate shapes. An example of the third one of the gate shapes is gate structure 330(3) in FIG. 3K, or the like. Examples of the sixth VGD shape also being aligned with the third one of the gate shapes is VGD structure 332(6) in FIG. 3K, or the like. In FIG. 3K, VGD structure 332(6) also is aligned with gate structure 330(3). From block 820, flow proceeds to block 822.

At block 822, seventh and eighth ones of the VGD shapes are aligned with a third one of the M_1st shapes. An example of the third one of the M_1st shapes is M0 shape 319(1) K in FIG. 3K, or the like. Examples of the seventh and eighth ones of the VGD shapes being aligned with a third one of the M_1st shapes are corresponding VGD structures 332(7) and 332(8) in FIG. 3K, or the like. In FIG. 3K, VGD structures 332(7) and 332(8) are aligned over M0 segment 319(1) K. From block 822, flow proceeds to block 824.

At block 824, the seventh and eighth VGD shapes are also aligned correspondingly with a fourth one of the MD shapes and a fourth one of the gate shapes. Examples of the fourth one of the MD shapes and a fourth one of the gate shapes are corresponding MD structure 328(4) and gate structure 330(4) in FIG. 3K, or the like. Examples of the seventh and eighth VGD shapes also being aligned correspondingly with a fourth one of the MD shapes and a fourth one of the gate shapes are corresponding VGD structures 332(7) and 332(8) in FIG. 3K, or the like. In FIG. 3K, VGD structures 332(7) and 332(8) also are correspondingly aligned with MD structures 328(4) and gate structure 330(4). From block 824, flow proceeds to block 826.

At block 826, a ninth one of the VGD shapes is aligned with a fourth one of the M_1st shapes and a fifth one of the MD shapes. Examples of the fourth one of the M_1st shapes and a fifth one of the MD shapes are corresponding M0 segment 316K and MD structure 328(5) in FIG. 3K, or the like. An example of the ninth one of the VGD shapes is VGD structure 332(9) in FIG. 3K, or the like. In FIG. 3K, VGD structure 332(9) is aligned over each of M0 segment 316K and MD structure 328(5).

Figure 9:
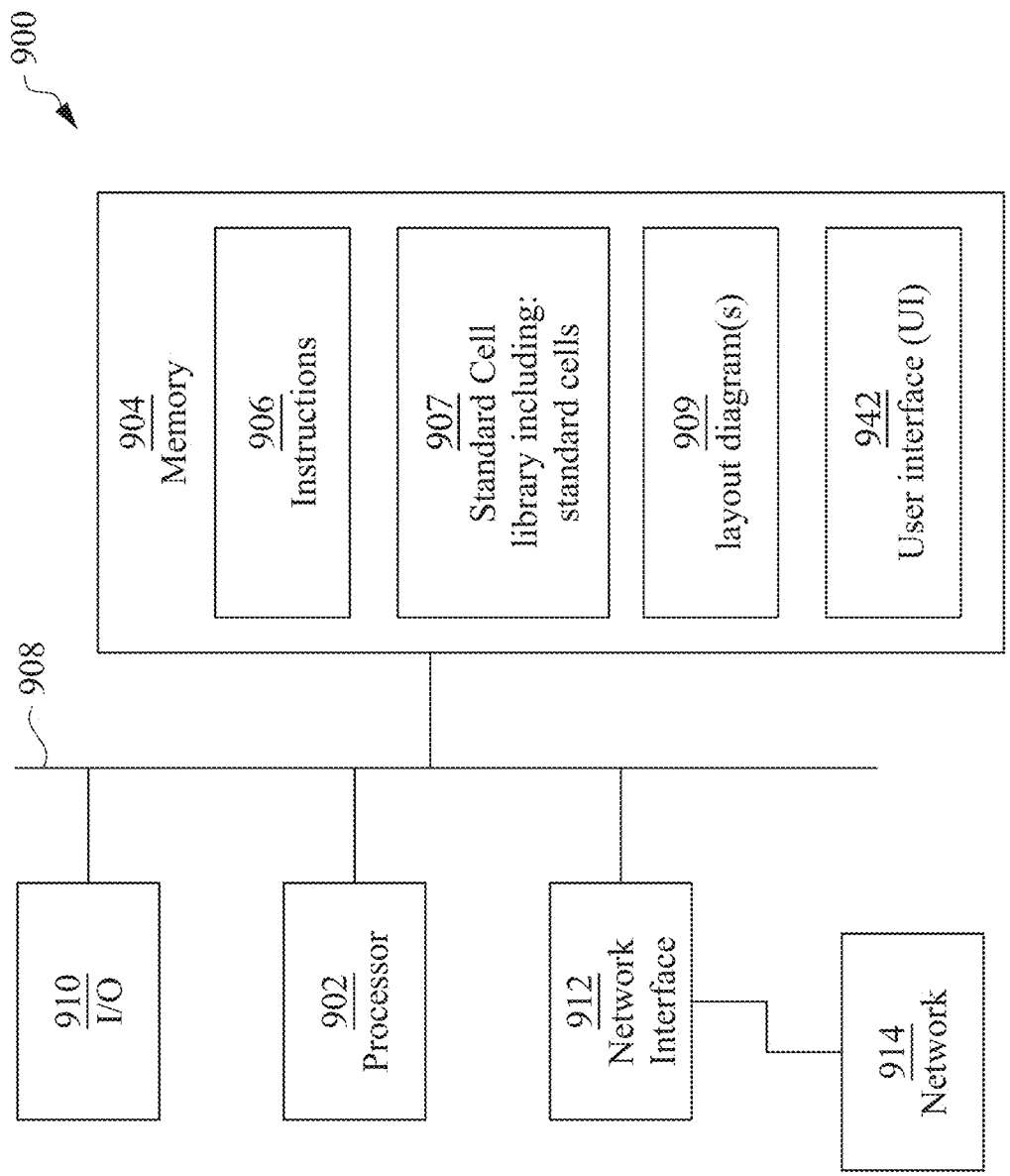
FIG. 9 is a block diagram of an electronic design automation (EDA) system, in accordance with some embodiments.

FIG. 9 is a block diagram of an electronic design automation (EDA) system 900, in accordance with some embodiments.

In some embodiments, EDA system 900 includes an APR system. Methods described herein of designing layout diagrams, in accordance with one or more embodiments, are implementable, for example, using EDA system 900, in accordance with some embodiments.

In some embodiments, EDA system 900 is a general purpose computing device including a hardware processor 902 and a non-transitory, computer-readable storage medium 904. Storage medium 904, amongst other things, is encoded with, i.e., stores, computer program code 906, i.e., a set of executable instructions. Execution of instructions 906 by hardware processor 902 represents (at least in part) an EDA tool which implements a portion or all of the methods described herein in accordance with one or more embodiments (hereinafter, the noted processes and/or methods).

Processor 902 is electrically coupled to computer-readable storage medium 904 via a bus 908. Processor 902 is also electrically coupled to an I/O interface 910 by bus 908. A network interface 912 is also electrically connected to processor 902 via bus 908. Network interface 912 is connected to a network 914, so that processor 902 and computer-readable storage medium 904 are capable of connecting to external elements via network 914. Processor 902 is configured to execute computer program code 906 encoded in computer-readable storage medium 904 in order to cause system 900 to be usable for performing a portion or all of the noted processes and/or methods. In one or more embodiments, processor 902 is a central processing unit (CPU), a multi-processor, a distributed processing system, an application specific integrated circuit (ASIC), and/or a suitable processing unit.

In one or more embodiments, computer-readable storage medium 904 is an electronic, magnetic, optical, electromagnetic, infrared, and/or a semiconductor system (or apparatus or device). For example, computer-readable storage medium 904 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 904 includes a compact disk-read only memory (CD-ROM), a compact disk-read/write (CD-R/W), and/or a digital video disc (DVD).

In one or more embodiments, storage medium 904 stores computer program code 906 configured to cause system 900 (where such execution represents (at least in part) the EDA tool) to be usable for performing a portion or all of the noted processes and/or methods. In one or more embodiments, storage medium 904 also stores information which facilitates performing a portion or all of the noted processes and/or methods. In one or more embodiments, storage medium 904 stores library 907 of standard cells including such standard cells as disclosed herein. In one or more embodiments, storage medium 904 stores one or more layout diagrams 909 corresponding to one or more layouts disclosed herein.

EDA system 900 includes I/O interface 910. I/O interface 910 is coupled to external circuitry. In one or more embodiments, I/O interface 910 includes a keyboard, keypad, mouse, trackball, trackpad, touchscreen, and/or cursor direction keys for communicating information and commands to processor 902.

EDA system 900 also includes network interface 912 coupled to processor 902.

Network interface 912 allows system 900 to communicate with network 914, to which one or more other computer systems are connected. Network interface 912 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 900.

System 900 is configured to receive information through I/O interface 910. The information received through I/O interface 910 includes one or more of instructions, data, design rules, libraries of standard cells, and/or other parameters for processing by processor 902. The information is transferred to processor 902 via bus 908. EDA system 900 is configured to receive information related to a UI through I/O interface 910. The information is stored in computer-readable medium 904 as user interface (UI) 942.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 900. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 10:
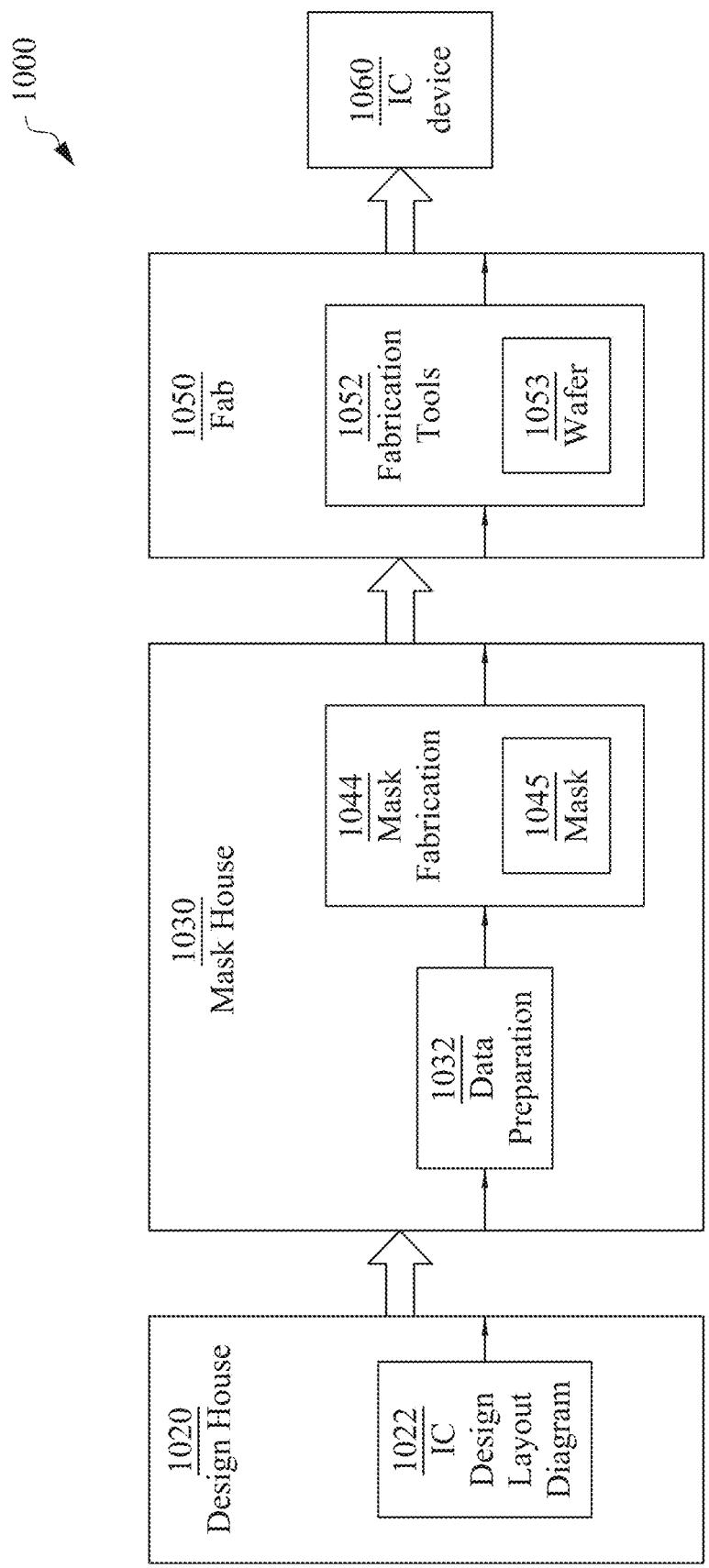
FIG. 10 is a block diagram of an integrated circuit (IC) manufacturing system, and an IC manufacturing flow associated therewith, in accordance with some embodiments.

FIG. 10 is a block diagram of an integrated circuit (IC) manufacturing system 1000, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1000.

In FIG. 10, IC manufacturing system 1000 includes entities, such as a design house 1020, a mask house 1030, and an IC manufacturer/fabricator ("fab") 1050, that interact with one another in the design, development, and manufacturing cycles and/or services related to manufacturing an IC device 1060. The entities in system 1000 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1020, mask house 1030, and IC fab 1050 is owned by a single larger company. In some embodiments, two or more of design house 1020, mask house 1030, and IC fab 1050 coexist in a common facility and use common resources.

Design house (or design team) 1020 generates an IC design layout diagram 1022. IC design layout diagram 1022 includes various geometrical patterns designed for an IC device 1060. The geometrical patterns correspond to patterns of metal, oxide, or semiconductor layers that make up the various components of IC device 1060 to be fabricated. The various layers combine to form various IC features. For example, a portion of IC design layout diagram 1022 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1020 implements a proper design procedure to form IC design layout diagram 1022. The design procedure includes one or more of logic design, physical design or place and route. IC design layout diagram 1022 is presented in one or more data files having information of the geometrical patterns. For example, IC design layout diagram 1022 can be expressed in a GDSII file format or DFII file format.

Mask house 1030 includes data preparation 1032 and mask fabrication 1044. Mask house 1030 uses IC design layout diagram 1022 to manufacture one or more masks 1045 to be used for fabricating the various layers of IC device 1060 according to IC design layout diagram 1022. Mask house 1030 performs mask data preparation 1032, where IC design layout diagram 1022 is translated into a representative data file ("RDF"). Mask data preparation 1032 provides the RDF to mask fabrication 1044. Mask fabrication 1044 includes a mask writer. A mask writer converts the RDF to an image on a substrate, such as a mask (reticle) 1045 or a semiconductor wafer 1053. The design layout diagram 1022 is manipulated by mask data preparation 1032 to comply with particular characteristics of the mask writer and/or requirements of IC fab 1050. In FIG. 10, mask data preparation 1032 and mask fabrication 1044 are illustrated as separate elements. In some embodiments, mask data preparation 1032 and mask fabrication 1044 can be collectively referred to as mask data preparation.

In some embodiments, mask data preparation 1032 includes optical proximity correction (OPC) which uses lithography enhancement techniques to compensate for image errors, such as those that can arise from diffraction, interference, other process effects and the like. OPC adjusts IC design layout diagram 1022. In some embodiments, mask data preparation 1032 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1032 includes a mask rule checker (MRC) that checks the IC design layout diagram 1022 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1022 to compensate for limitations during mask fabrication 1044, which may undo part of the modifications performed by OPC in order to meet mask creation rules.

In some embodiments, mask data preparation 1032 includes lithography process checking (LPC) that simulates processing that will be implemented by IC fab 1050 to fabricate IC device 1060. LPC simulates this processing based on IC design layout diagram 1022 to create a simulated manufactured device, such as IC device 1060. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1022.

It should be understood that the above description of mask data preparation 1032 has been simplified for the purposes of clarity. In some embodiments, data preparation 1032 includes additional features such as a logic operation (LOP) to modify the IC design layout diagram 1022 according to manufacturing rules. Additionally, the processes applied to IC design layout diagram 1022 during data preparation 1032 may be executed in a variety of different orders.

After mask data preparation 1032 and during mask fabrication 1044, a mask 1045 or a group of masks 1045 are fabricated based on the modified IC design layout diagram 1022. In some embodiments, mask fabrication 1044 includes performing one or more lithographic exposures based on IC design layout diagram 1022. In some embodiments, an electron-beam (e-beam) or a mechanism of multiple e-beams is used to form a pattern on a mask (photomask or reticle) 1045 based on the modified IC design layout diagram 1022. Mask 1045 can be formed in various technologies. In some embodiments, mask 1045 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1045 includes a transparent substrate (e.g., fused quartz) and an opaque material (e.g., chromium) coated in the opaque regions of the binary mask. In another example, mask 1045 is formed using a phase shift technology. In a phase shift mask (PSM) version of mask 1045, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1044 is used in a variety of processes. For example, such a mask(s) is used in an ion implantation process to form various doped regions in semiconductor wafer 1053, in an etching process to form various etching regions in semiconductor wafer 1053, and/or in other suitable processes.

IC fab 1050 includes fabrication tools 1052 configured to execute various manufacturing operations on semiconductor wafer 1053 such that IC device 1060 is fabricated in accordance with the mask(s), e.g., mask 1045. In various embodiments, fabrication tools 1052 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1050 uses mask(s) 1045 fabricated by mask house 1030 to fabricate IC device 1060. Thus, IC fab 1050 at least indirectly uses IC design layout diagram 1022 to fabricate IC device 1060. In some embodiments, semiconductor wafer 1053 is fabricated by IC fab 1050 using mask(s) 1045 to form IC device 1060. In some embodiments, the IC fabrication includes performing one or more lithographic exposures based at least indirectly on IC design layout diagram 1022. Semiconductor wafer 1053 includes a silicon substrate or other proper substrate having material layers formed thereon. Semiconductor wafer 1053 further includes one or more of various doped regions, dielectric features, multilevel interconnects, and the like (formed at subsequent manufacturing steps).

Details regarding an integrated circuit (IC) manufacturing system (e.g., system 1000 of FIG. 10), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, a method (of decoupling from voltage variations in a first voltage drop between first and second reference voltage rails) includes: electrically coupling one or more components to form a decoupling capacitance (decap) circuit; electrically coupling one or more components to form a filtered biasing circuit; and making an unswitched series electrical coupling of the decap circuit and the filtered biasing circuit between the first and second reference voltage rails.

In some embodiments, the making an unswitched series electrical coupling includes: electrically coupling the decap circuit between the first or second reference voltage rail and a first node; and electrically coupling the filtered biasing circuit between the first node and correspondingly the second or first reference voltage rail.

In some embodiments, the electrically coupling the filtered biasing circuit includes: electrically coupling one or more components to form a first filter; electrically coupling one or more components to form a second filter; configuring each of the first filter and the second filter as a same type of filter including configuring each of the first filter and the second filter as a high pass filter or configuring each of the first filter and the second filter as a low pass filter; electrically coupling the first filter between (1) the first or second reference voltage rails and (2) the first node; and electrically coupling the second filter between the first and second reference voltage rails.

In some embodiments, the electrically coupling the first filter includes: electrically coupling first and second components to each other at a second node and in series between (1) the first or second reference voltage rails and (2) the first node; the electrically coupling the second filter includes electrically coupling third and fourth components to each other at a third node and in series between the first and second reference voltage rails; and the electrically coupling the filtered biasing circuit further includes electrically coupling a first control terminal of the filtered biasing circuit to the second node, and electrically coupling a second control terminal of the filtered biasing circuit to the third node.

In some embodiments, the electrically coupling the first filter further includes using a first capacitor as the first component, and using a first resistor as the second component; and the electrically coupling the second filter further includes using a second capacitor as the first component, and using a second resistor as the second component.

In some embodiments, the electrically coupling the filtered biasing circuit further includes electrically coupling each of a first switch and a second switch in parallel between the first node and the second reference voltage rail, or electrically coupling each of the first switch and the second switch in parallel between the first node and the first reference voltage rail; the first control terminal being a control input of the first switch; and the second control terminal being a control input of the second switch.

In some embodiments, the electrically coupling each of a first switch and a second switch in parallel between the first node and the second reference voltage rail includes electrically coupling an N-type metal-oxide-semiconductor field-effect transistor (MOSFET) as the first switch and a P-type MOSFET (PFET) as the second switch in parallel between the first node and the second reference voltage rail; or the electrically coupling each of the first switch and the second switch in parallel between the first node and the first reference voltage rail includes electrically coupling an N-type metal-oxide-semiconductor field-effect transistor (MOSFET) as the first switch and a P-type MOSFET (PFET) as the second switch in parallel between the first node and the first reference voltage rail.

In some embodiments, the electrically coupling one or more components to form a filtered biasing circuit includes electrically coupling metal-oxide-semiconductor field-effect transistor (MOSFETs) including: electrically coupling an N-type MOSFET (NFET) and a P-type MOSFET (PFET) in parallel between an input and an output of the filtered biasing circuit.

In some embodiments, the electrically coupling one or more components to form a filtered biasing circuit further includes: electrically coupling first and second components to each other at a first node and in series between (1) the first or second reference voltage rails and (2) a second node as a first filter; electrically coupling third and fourth components to each other at a third node and in series between the first and second reference voltage rails as a second filter; and either electrically coupling a gate terminal of the NFET to the first node and a gate terminal of the PFET to the third node, or electrically coupling a gate terminal of the NFET to the third node and a gate terminal of the PFET to the first node.

In some embodiments, the electrically coupling one or more components to form a decoupling capacitance (decap) circuit includes electrically coupling metal-oxide-semiconductor field-effect transistor (MOSFETs) including: electrically coupling an N-type MOSFET (NFET) in a capacitor configuration between (1) a first node and (2) the first and second reference voltage rails.

In some embodiments, the electrically coupling one or more components to form a filtered biasing circuit includes electrically coupling one or more components to form a first high pass filter (HPF), and electrically coupling one or more components to form a second HPF; and the electrically coupling an N-type MOSFET (NFET) in a capacitor configuration includes electrically coupling a gate terminal of the NFET to the first reference voltage rail and electrically coupling source and terminals of the NFET to the first node.

In some embodiments, the electrically coupling one or more components to form a filtered biasing circuit includes electrically coupling one or more components to form a first low pass filter (LPF), and electrically coupling one or more components to form a second LPF; and the electrically coupling an N-type MOSFET (NFET) in a capacitor configuration includes electrically coupling a gate terminal of the NFET to the second reference voltage rail, and electrically coupling source and terminals of the NFET to the first node.

In some embodiments, a method (of decoupling from voltage variations in a first voltage drop between first and second reference voltage rails) includes: electrically coupling one or more components to form a decoupling capacitance (decap) circuit;

electrically coupling one or more components to form a filtered biasing circuit including (A) electrically coupling an metal-oxide-semiconductor field-effect transistor (MOSFET) of N-type (NFET) and a MOSFET of P-type (PFET) in parallel between an input and an output of the filtered biasing circuit, (B) electrically coupling first and second components to each other at a first node and in series between (1) the first or second reference voltage rails and (2) a second node as a first filter; (C) electrically coupling third and fourth components to each other at a third node and in series between the first and second reference voltage rails as a second filter, and either (D) or (E) where (D) is electrically coupling a gate terminal of the NFET to the first node and a gate terminal of the PFET to the third node, and (E) is electrically coupling a gate terminal of the NFET to the third node and a gate terminal of the PFET to the first node; and making an unswitched series electrical coupling of the decap circuit and the filtered biasing circuit between the first and second reference voltage rails.

In some embodiments, the electrically coupling the filtered biasing circuit further includes: where the gate terminal of the NFET is electrically coupled to the first node and a gate terminal of the PFET to the third node, configuring each of the first filter and the second filter as a high pass filter; or where the gate terminal of the NFET is electrically coupled to the third node and a gate terminal of the PFET to the first node, configuring each of the first filter and the second filter as a low pass filter.

In some embodiments, the electrically coupling one or more components to form a decoupling capacitance (decap) circuit includes electrically coupling metal-oxide-semiconductor field-effect transistor (MOSFETs) including: electrically coupling an N-type MOSFET (NFET) in a capacitor configuration between (1) the second node and (2) the first and second reference voltage rails.

In some embodiments, the electrically coupling one or more components to form a decoupling capacitance (decap) circuit further includes: where the gate terminal of the NFET is electrically coupled to the first node and a gate terminal of the PFET to the third node, electrically coupling a gate terminal of the NFET to the first reference voltage rail, and electrically coupling source and terminals of the NFET to the first node; or where the gate terminal of the NFET is electrically coupled to the third node and a gate terminal of the PFET to the first node, electrically coupling a gate terminal of the NFET to the second reference voltage rail, and electrically coupling source and terminals of the NFET to the first node.

In some embodiments, a method (of forming semiconductor device that includes a decoupling capacitance (decap) system) includes: forming active regions including doping areas of a substrate; forming source/drain (S/D) regions including doping first areas of the active regions, the S/D regions representing first transistor-components, wherein second areas of the active regions which are between corresponding S/D regions are channel regions representing second transistor-components; forming gate lines over corresponding ones of the channel regions, the gate lines representing third transistor-components; forming metal-to-S/D (MD) contact structures over corresponding ones of the S/D regions, the MD contact structures representing fourth transistor-components; forming via-to-gate/MD (VGD) structures representing fifth transistor-components over corresponding ones of the gate lines and the MD contact structures, the VGD structures electrically coupling a first set of the first to fourth transistor-components as an alpha metal-oxide-semiconductor field-effect transistor (MOSFETs), and a second set of the first to fourth transistor-components as beta MOSFETs; and forming metallization segments and interconnection structures on an interleaved layer basis over corresponding areas some of which correspondingly include the alpha MOSFET and the beta MOSFETs; and wherein: the forming metallization segments and interconnection structures results in first and second capacitors, first and second resistors, and first and second reference voltage rails; and the forming metallization segments and interconnection structures (A) electrically couples the alpha MOSFET as a decoupling capacitance (decap) circuit, (B) electrically couples the first and second capacitors, the first and second resistors and the beta MOSFETs as a filtered biasing circuit, and (C) electrically couples the decap circuit and the filtered biasing circuit as unswitched in series between the first and second reference voltage rails.

In some embodiments, the forming metallization segments and interconnection structures further electrically couples: the decap circuit between the first or second reference voltage rail and a first node; and the filtered biasing circuit between the first node and correspondingly the second or first reference voltage rail.

In some embodiments, the forming metallization segments and interconnection structures further electrically couples: the first capacitor and the first resistor to form a first filter; the second capacitor and the second resistor to form a second filter; the first filter between (1) the first or second reference voltage rails and (2) the first node; and the second filter between the first and second reference voltage rails.

In some embodiments, the forming metallization segments and interconnection structures further electrically couples: each of the first filter and the second filter as a high pass filter; or each of the first filter and the second filter as a low pass filter.

In some embodiments, forming metallization segments and interconnection structures further electrically couples: the first capacitor and the first resistor of the first filter to each other at a second node and in series between (1) the first or second reference voltage rails and (2) the first node; the second capacitor and the second resistor of the second filter to each other at a third node and in series between the first and second reference voltage rails; and in accordance with either a set A of circumstances or a set B of circumstances; the set A of circumstances being a gate terminal of a first one of the beta MOSFETs to the second node and a gate terminal of a second one of the beta MOSFETs to the third node; and the set B of circumstances being a gate terminal of the first one of the beta MOSFETs to the third node and a gate terminal of the second one of the beta MOSFETs to the second node.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of decoupling from voltage variations in a first voltage drop between first and second reference voltage rails, the method comprising:
   electrically coupling one or more components to form a decoupling capacitance (decap) circuit;
   electrically coupling one or more components to form a filtered biasing circuit; and
   making an unswitched series electrical coupling of the decap circuit and the filtered biasing circuit between the first and second reference voltage rails.

2. The method of claim 1, wherein the making an unswitched series electrical coupling includes:
   electrically coupling the decap circuit between the first or second reference voltage rail and a first node; and electrically coupling the filtered biasing circuit between the first node and correspondingly the second or first reference voltage rail.

3. The method of claim 2, wherein the electrically coupling the filtered biasing circuit includes:
electrically coupling one or more components to form a first filter;
electrically coupling one or more components to form a second filter;
configuring each of the first filter and the second filter as a same type of filter including:
configuring each of the first filter and the second filter as a high pass filter; or
configuring each of the first filter and the second filter as a low pass filter;
electrically coupling the first filter between (1) the first or second reference voltage rails and (2) the first node; and
electrically coupling the second filter between the first and second reference voltage rails.

4. The method of claim 3, wherein:
the electrically coupling the first filter includes:
electrically coupling first and second components to each other at a second node and in series between (1) the first or second reference voltage rails and (2) the first node;
the electrically coupling the second filter includes:
electrically coupling third and fourth components to each other at a third node and in series between the first and second reference voltage rails; and
the electrically coupling the filtered biasing circuit further includes:
electrically coupling a first control terminal of the filtered biasing circuit to the second node; and
electrically coupling a second control terminal of the filtered biasing circuit to the third node.

5. The method of claim 4, wherein:
the electrically coupling the first filter further includes:
using a first capacitor as the first component; and
using a first resistor as the second component; and
the electrically coupling the second filter further includes:
using a second capacitor as the third component; and
using a second resistor as the fourth component.

6. The method of claim 4, wherein:
the electrically coupling the filtered biasing circuit further includes:
electrically coupling each of a first switch and a second switch in parallel between the first node and the second reference voltage rail; or
electrically coupling each of the first switch and the second switch in parallel between the first node and the first reference voltage rail;
the first control terminal being a control input of the first switch; and
the second control terminal being a control input of the second switch.

7. The method of claim 6, wherein:
the electrically coupling each of a first switch and a second switch in parallel between the first node and the second reference voltage rail includes:
electrically coupling an N-type metal-oxide-semiconductor field-effect transistor (MOSFET) as the first switch and a P-type MOSFET (PFET) as the second switch in parallel between the first node and the second reference voltage rail; or the electrically coupling each of the first switch and the second switch in parallel between the first node and the first reference voltage rail includes:
electrically coupling an N-type metal-oxide-semiconductor field-effect transistor (MOSFET) as the first switch and a P-type MOSFET (PFET) as the second switch in parallel between the first node and the first reference voltage rail.

8. The method of claim 1, wherein the electrically coupling one or more components to form a filtered biasing circuit includes:
electrically coupling metal-oxide-semiconductor field-effect transistor (MOSFETs) including:
electrically coupling an N-type MOSFET (NFET) and a P-type MOSFET (PFET) in parallel between an input and an output of the filtered biasing circuit.

9. The method of claim 8, wherein the electrically coupling one or more components to form a filtered biasing circuit further includes:
electrically coupling first and second components to each other at a first node and in series between (1) the first or second reference voltage rails and (2) a second node as a first filter;
electrically coupling third and fourth components to each other at a third node and in series between the first and second reference voltage rails as a second filter; and
either:
electrically coupling a gate terminal of the NFET to the first node and a gate terminal of the PFET to the third node; or
electrically coupling a gate terminal of the NFET to the third node and a gate terminal of the PFET to the first node.

10. The method of claim 1, wherein the electrically coupling one or more components to form a decoupling capacitance (decap) circuit includes:
electrically coupling metal-oxide-semiconductor field-effect transistor (MOSFETs) including:
electrically coupling an N-type MOSFET (NFET) in a capacitor configuration between (1) a first node and (2) the first and second reference voltage rails.

11. The method of claim 10, wherein:
the electrically coupling one or more components to form a filtered biasing circuit includes:
electrically coupling one or more components to form a first high pass filter (HPF); and
electrically coupling one or more components to form a second HPF; and
the electrically coupling an N-type MOSFET (NFET) in a capacitor configuration includes:
electrically coupling a gate terminal of the NFET to the first reference voltage rail; and
electrically coupling source and terminals of the NFET to the first node.

12. The method of claim 10, wherein:
the electrically coupling one or more components to form a filtered biasing circuit includes:
electrically coupling one or more components to form a first low pass filter (LPF); and
electrically coupling one or more components to form a second LPF; and
the electrically coupling an N-type MOSFET (NFET) in a capacitor configuration includes:
electrically coupling a gate terminal of the NFET to the second reference voltage rail; and
electrically coupling source and terminals of the NFET to the first node.

13. A method of decoupling from voltage variations in a first voltage drop between first and second reference voltage rails, the method comprising:
  electrically coupling one or more components to form a decoupling capacitance (decap) circuit;
  electrically coupling one or more components to form a filtered biasing circuit including:
    electrically coupling an metal-oxide-semiconductor field-effect transistor (MOSFET) of N-type (NFET) and a MOSFET of P-type (PFET) in parallel between an input and an output of the filtered biasing circuit;
    electrically coupling first and second components to each other at a first node and in series between (1) the first or second reference voltage rails and (2) a second node as a first filter;
    electrically coupling third and fourth components to each other at a third node and in series between the first and second reference voltage rails as a second filter; and
    either:
      electrically coupling a gate terminal of the NFET to the first node and a gate terminal of the PFET to the third node; or
      electrically coupling a gate terminal of the NFET to the third node and a gate terminal of the PFET to the first node; and
  making an unswitched series electrical coupling of the decap circuit and the filtered biasing circuit between the first and second reference voltage rails.

14. The method of claim 13, wherein the electrically coupling the filtered biasing circuit further includes:
  where the gate terminal of the NFET is electrically coupled to the first node and a gate terminal of the PFET to the third node,
    configuring each of the first filter and the second filter as a high pass filter; or
  where the gate terminal of the NFET is electrically coupled to the third node and a gate terminal of the PFET to the first node,
    configuring each of the first filter and the second filter as a low pass filter.

15. The method of claim 13, wherein the electrically coupling one or more components to form a decoupling capacitance (decap) circuit includes:
  electrically coupling metal-oxide-semiconductor field-effect transistor (MOSFETs) including:
    electrically coupling an N-type MOSFET (NFET) in a capacitor configuration between (1) the second node and (2) the first and second reference voltage rails.

16. A method of forming semiconductor device that includes a decoupling capacitance (decap) system, the method comprising:
  forming active regions including doping areas of a substrate;
  forming source/drain (S/D) regions including doping first areas of the active regions, the S/D regions representing first transistor-components, wherein second areas of the active regions which are between corresponding S/D regions are channel regions representing second transistor-components;
  forming gate lines over corresponding ones of the channel regions, the gate lines representing third transistor-components;
  forming metal-to-S/D (MD) contact structures over corresponding ones of the S/D regions, the MD contact structures representing fourth transistor-components;
  forming via-to-gate/MD (VGD) structures representing fifth transistor-components over corresponding ones of the gate lines and the MD contact structures, the VGD structures electrically coupling:
    a first set of the first to fourth transistor-components as an alpha metal-oxide-semiconductor field-effect transistor (MOSFETs); and
    a second set of the first to fourth transistor-components as beta MOSFETs; and
  forming metallization segments and interconnection structures on an interleaved layer basis over corresponding areas some of which correspondingly include the alpha MOSFET and the beta MOSFETs; and
  wherein:
    the forming metallization segments and interconnection structures results in first and second capacitors, first and second resistors, and first and second reference voltage rails; and
    the forming metallization segments and interconnection structures electrically couples:
      the alpha MOSFET as a decoupling capacitance (decap) circuit;
      the first and second capacitors, the first and second resistors and the beta MOSFETs as a filtered biasing circuit; and
      the decap circuit and the filtered biasing circuit as unswitched in series between the first and second reference voltage rails.

17. The method of claim 16, wherein the forming metallization segments and interconnection structures further electrically couples:
  the decap circuit between the first or second reference voltage rail and a first node; and
  the filtered biasing circuit between the first node and correspondingly the second or first reference voltage rail.

18. The method of claim 17, wherein the forming metallization segments and interconnection structures further electrically couples:
  the first capacitor and the first resistor to form a first filter;
  the second capacitor and the second resistor to form a second filter;
  the first filter between (1) the first or second reference voltage rails and (2) the first node; and
  the second filter between the first and second reference voltage rails.

19. The method of claim 18, wherein the forming metallization segments and interconnection structures further electrically couples:
  each of the first filter and the second filter as a high pass filter; or
  each of the first filter and the second filter as a low pass filter.

20. The method of claim 18, wherein the forming metallization segments and interconnection structures further electrically couples:
  the first capacitor and the first resistor of the first filter to each other at a second node and in series between (1) the first or second reference voltage rails and (2) the first node;
  the second capacitor and the second resistor of the second filter to each other at a third node and in series between the first and second reference voltage rails; and
  in accordance with either a set A of circumstances or a set B of circumstances;
    the set A of circumstances being a gate terminal of a first one of the beta MOSFETs to the second node and a gate terminal of a second one of the beta MOSFETs to the third node; and the set B of circumstances being a gate terminal of the first one of the beta MOSFETs to the third node and a gate terminal of the second one of the beta MOSFETs to the second node.

* * * * *